US011114460B2

(12) United States Patent
Kanamori et al.

(10) Patent No.: US 11,114,460 B2
(45) Date of Patent: Sep. 7, 2021

(54) SEMICONDUCTOR MEMORY DEVICES

(71) Applicant: Samsung Electronics Co., Ltd., Suwon-si (KR)

(72) Inventors: Kohji Kanamori, Seoul (KR); Seogoo Kang, Suwon-si (KR); Shinhwan Kang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/690,929

(22) Filed: Nov. 21, 2019

(65) Prior Publication Data

US 2020/0350329 A1 Nov. 5, 2020

(30) Foreign Application Priority Data

Apr. 30, 2019 (KR) .................. 10-2019-0050984

(51) Int. Cl.
*H01L 27/11582* (2017.01)
*H01L 29/417* (2006.01)

(52) U.S. Cl.
CPC .. *H01L 27/11582* (2013.01); *H01L 29/41741* (2013.01)

(58) Field of Classification Search
None
See application file for complete search history.

(56) References Cited

U.S. PATENT DOCUMENTS

| 9,508,730 | B2 | 11/2016 | Lee et al. |
| 9,716,099 | B2 | 7/2017 | Choi |
| 9,824,966 | B1 | 11/2017 | Kanakamedala et al. |
| 9,859,296 | B2 | 1/2018 | Park et al. |
| 9,941,298 | B2 | 4/2018 | Huang et al. |
| 9,991,279 | B2 | 6/2018 | Lee et al. |
| 10,062,707 | B2 | 8/2018 | Lee |
| 2016/0268302 | A1* | 9/2016 | Lee .................. H01L 27/11565 |
| 2017/0110471 | A1 | 4/2017 | Yoshimizu et al. |
| 2018/0366488 | A1 | 12/2018 | Choi et al. |
| 2018/0374866 | A1 | 12/2018 | Makala et al. |
| 2020/0027894 | A1* | 1/2020 | Son .................. H01L 27/11556 |

\* cited by examiner

*Primary Examiner* — Hsien Ming Lee

(74) *Attorney, Agent, or Firm* — Harness, Dickey & Pierce, P.L.C.

(57) ABSTRACT

A semiconductor memory device including a first semiconductor layer, a second semiconductor layer, and a third semiconductor layer between the first and second semiconductor layers, gate electrodes arranged on the second semiconductor layer and spaced apart from each other in a first direction perpendicular to an upper surface of the second semiconductor layer, and channel structures penetrating the first, second and third semiconductor layers and the gate electrodes, each respective channel structure of channel structures including a gate insulating film, a channel layer, and a buried insulating film, the gate insulating film including a tunnel insulating film adjacent to the channel layer, a charge blocking film adjacent to the gate electrodes, and a charge storage film between the tunnel insulating film and the charge blocking film, and the charge storage film including an upper cover protruding toward the outside of the respective channel structure.

20 Claims, 21 Drawing Sheets

SEMICONDUCTOR MEMORY DEVICES

CROSS-REFERENCE TO RELATED APPLICATION

This application claims the benefit of Korean Patent Application No. 10-2019-0050984, filed on Apr. 30, 2019, in the Korean Intellectual Property Office, the disclosure of which is incorporated herein in its entirety by reference.

BACKGROUND

Some example embodiments relate to semiconductor memory devices. More particularly, some example embodiments relate to semiconductor memory devices in which the degree of integration is enhanced.

Recently, there has been a demand for large capacity and highly integrated semiconductor memory devices resulting from multifunctionalization of information communication devices. As the degree of integration of semiconductor memory devices increases, the influence of the process distribution on the performance of semiconductor memory devices is likewise increasing. Accordingly, various methods of controlling the process distribution in order to improve the reliability of the semiconductor memory devices would be desirable.

SUMMARY

Some example embodiments provide a semiconductor memory device and a manufacturing method thereof with improved reliability.

Some example embodiments are not limited to the above-mentioned tasks, and other tasks not mentioned may be clearly understood by those skilled in the art from the following description.

According to some example embodiments, there is provided a semiconductor memory device including a first semiconductor layer, a second semiconductor layer, and a third semiconductor layer between the first and second semiconductor layers, a plurality of gate electrodes arranged on the second semiconductor layer and spaced apart from each other in a first direction perpendicular to an upper surface of the second semiconductor layer, and a plurality of channel structures penetrating the first, second and third semiconductor layers and the plurality of gate electrodes, each respective channel structure of the plurality of channel structures including a gate insulating film, a channel layer, and a buried insulating film, the gate insulating film including a tunnel insulating film adjacent to the channel layer, a charge blocking film adjacent to the plurality of gate electrodes, and a charge storage film between the tunnel insulating film and the charge blocking film, and the charge storage film includes an upper cover protruding toward the outside of the respective channel structure.

According to some example embodiments, there is provided a semiconductor memory device including a first semiconductor layer and a second semiconductor layer arranged on the first semiconductor layer, a plurality of gate electrodes arranged on the second semiconductor layer and spaced apart from each other in a first direction perpendicular to an upper surface of the second semiconductor layer, and a plurality of channel structures penetrating the first and second semiconductor layers and the plurality of gate electrodes in the first direction, each of the plurality of channel structures including a gate insulating film, a channel layer, and a buried insulating film, the channel layer being connected to the first semiconductor layer, and the gate insulating film including an upper charge storage film in contact with a side surface of the second semiconductor layer.

According to some example embodiments, there is provided a semiconductor memory device including a first semiconductor layer, a second semiconductor layer on the first semiconductor layer, and a third semiconductor layer between the first semiconductor layer and the second semiconductor layer, a plurality of gate electrodes spaced apart from each other in a first direction perpendicular to an upper surface of the second semiconductor layer, the plurality of gate electrodes forming a word line cut in the first direction that separates the plurality of gate electrodes in a second direction perpendicular to the first direction, and a plurality of channel structures penetrating the second and third semiconductor layers and the plurality of the gate electrodes in the first direction, each respective channel structure of the plurality of channel structures including a gate insulating film, a channel layer, and a buried insulating film, the third semiconductor layer includes an opening that partially exposes an upper surface of the first semiconductor layer, the second semiconductor layer includes a support connection structure in contact with the first semiconductor layer at the opening, the gate insulating film including an upper tunnel insulating film, an upper charge blocking film, and an upper charge storage film between the upper tunnel insulating film and the upper charge blocking film, and the upper charge storage film includes an upper cover protruding toward the outside of the respective channel structure.

BRIEF DESCRIPTION OF THE DRAWINGS

Some example embodiments will be more clearly understood from the following detailed description taken in conjunction with the accompanying drawings in which.

DETAILED DESCRIPTION

Figure 1A:
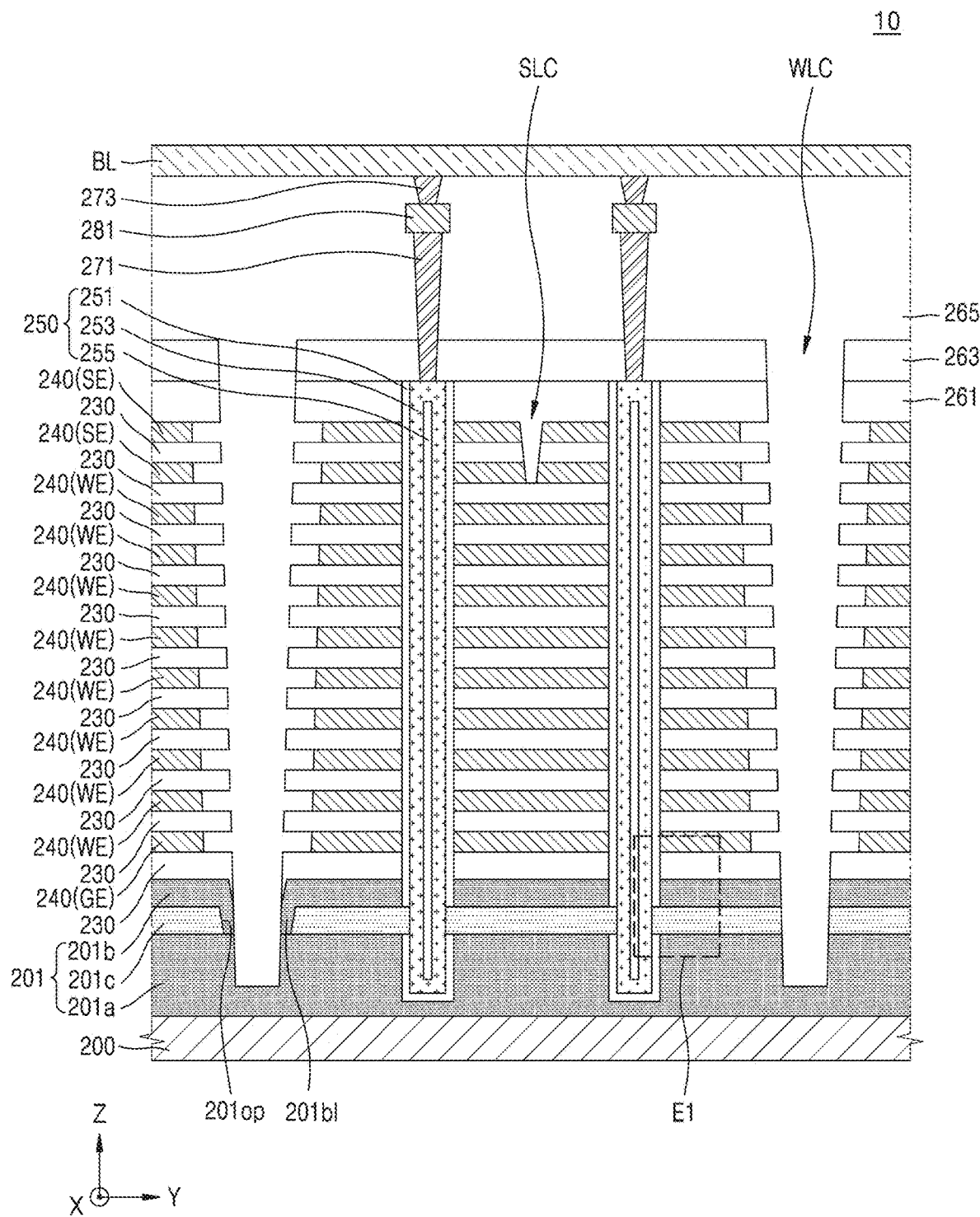
FIG. 1A is a cross-sectional view for explaining a semiconductor memory device according to some example embodiments.
Figure 1B:
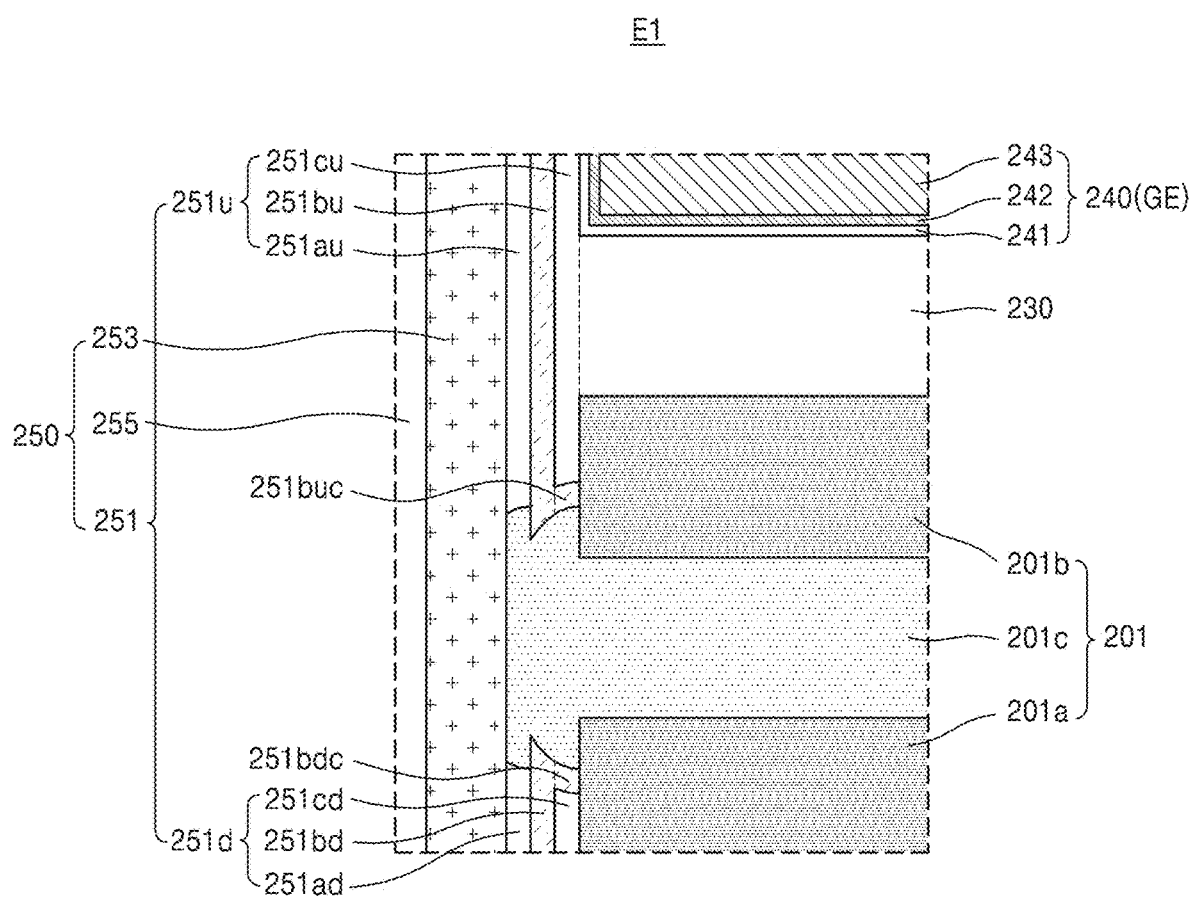
FIG. 1B is an enlarged partial cross-sectional view of a portion of FIG. 1A.

FIG. 1A is a cross-sectional view for explaining a semiconductor memory device 10 according to some example embodiments, and FIG. 1B is an enlarged partial cross-sectional view of a region E1 of FIG. 1A.

Referring to FIGS. 1A and 1B, the semiconductor memory device 10 may include a conductive flat plate 200, a semiconductor layer 201 arranged on the conductive flat plate 200, and/or insulating films 230 and gate electrodes 240 alternately stacked on the semiconductor layer 201. The semiconductor memory device 10 may include first to third upper insulating films 261, 263, and/or 265 (e.g., first upper insulating film 261, second upper insulating film 263, and third upper insulating film 265) arranged on a structure in which the insulating films 230 and the gate electrodes 240 are alternately stacked (e.g., a structure constituting the alternately stacked insulating films 230 and gate electrodes 240). According to some example embodiments, the semiconductor memory device 10 may further include channel structures 250 that penetrate the insulating films 230 and the gate electrodes 240, first and/or second bit line contact vias 271 and/or 273, an upper conductive pattern 281 (e.g., conductive structure and/or region), and/or a bit line BL, with which the channel structures 250 may operate as a memory cell array. According to some example embodiments, the gate electrodes 240 include uppermost and second-uppermost gate electrodes 240 (SE), a lowermost gate electrode 240 (GE), and several gate electrodes 240 (WE) between the second-uppermost gate electrode 240 (SE) and the lowermost gate electrode 240 (GE).

According to some example embodiments, the conductive flat plate 200 may be in the form of a flat plate. According to some example embodiments, the conductive flat plate 200 may include tungsten (W) or a tungsten (W) compound. Peripheral circuits may be formed below the conductive flat plate 200, and/or at a location horizontally apart (e.g., in the Y and/or X direction as illustrated in FIG. 1A) from a common source line. According to some example embodiments, the peripheral circuits may include circuits for controlling the operation of semiconductor memory device 10, e.g., a control logic, a row decoder, a page buffer, and/or the like. The conductive flat plate 200 may be formed on a semiconductor substrate such as a bulk silicon substrate, a silicon on insulator (SOI) substrate, a germanium substrate, a germanium on insulator (GOI) substrate, a silicon germanium substrate, and/or may be formed on an epitaxial thin film obtained by performing selective epitaxial growth (SEG).

According to some example embodiments, the semiconductor layer 201 may support the insulating films 230 and the gate electrodes 240. According to some example embodiments, the semiconductor layer 201 may include, but is not limited to, a plurality of layers. For example, the semiconductor layer may also include and/or constitute a single layer.

According to some example embodiments, the semiconductor layer 201 may include a first semiconductor layer 201a arranged on the conductive flat plate 200, a second semiconductor layer 201b arranged on the first semiconductor layer 201a, and a third semiconductor layer 201c arranged between the first semiconductor layer 201a and the second semiconductor layer 201b. According to some example embodiments, the first semiconductor layer 201a may be in contact with the third semiconductor layer 201c. According to some example embodiments, the third semiconductor layer 201c may be in contact with the second semiconductor layer 201b. According to some example embodiments, the third semiconductor layer 201c may include an opening 201op that exposes a portion of an upper surface of the first semiconductor layer 201a. According to some example embodiments, the second semiconductor layer 201b may include a support connection structure 201b1 in contact with the first semiconductor layer 201a through the opening 201op. According to some example embodiments, the first to third semiconductor layers 201a, 201b, and 201c may include polysilicon. According to some example embodiments, the first to third semiconductor layers 201a, 201b, and 201c may include doped polysilicon. According to some example embodiments, the first to third semiconductor layers 201a, 201b, and 201c may be doped at the same or substantially the same concentration, but some example embodiments are not limited thereto. According to some example embodiments, when the first to third semiconductor layers 201a, 201b, and 201c are doped at the same or substantially the same concentration, the first to third semiconductor layers 201a, 201b, and 201c may be integrated into a single layer, but some example embodiments are not limited thereto. Even when the first to third semiconductor layers 201a, 201b, 201c have the same concentration or substantially the same concentration, the first to third semiconductor layers 201a, 201b, 201c may also be distinguished from each other. According to some example embodiments, the first to third semiconductor layers 201a, 201b, 201c may be separate layers doped with different concentrations.

Herein, a direction perpendicular or substantially perpendicular to an upper surface of the semiconductor layer 201 is referred to as a first direction (a Z direction) and two directions parallel or substantially parallel to the upper surface of the semiconductor layer 201 are referred to as second and third directions (an X direction and a Y direction). The second and third directions (the X direction and Y direction) may be perpendicular or substantially perpendicular to each other. Herein, the term "vertical direction" may refer to a direction parallel or substantially parallel to the first direction (the Z direction), and the term "vertical level" may refer to a height from a reference plane (e.g., the upper surface of the semiconductor layer 201) in the first direction (the Z direction). In addition, the term "horizontal direction" may refer to the second direction (the X direction) or the third direction (the Y direction), or may refer to a direction perpendicular or substantially perpendicular to the first direction (the Z direction) and oblique to the second direction (the X direction) and the third direction (the Y direction). According to some example embodiments, the X direction, Y direction, and/or Z direction may also include a direction opposite thereto. Unless otherwise stated in all the following drawings, the definition of the directions is the same as in FIG. 1A.

According to some example embodiments, the gate electrodes 240 and the insulating films 230 may be alternately arranged in the first direction (the Z direction). According to some example embodiments, gate electrodes 240 may be insulated from each other by the insulating films 230 arranged therebetween. According to some example embodiments, the gate electrodes 240 of the same layer or similar layers may be separated by a word line cut (WLC) and/or a string select line cut (SLC). According to some example embodiments, the gate electrodes 240 may extend in the second direction (the X direction).

According to some example embodiments, the gate electrodes 240 may include a conductive material. According to some example embodiments, the gate electrodes 240 may include, but are not limited to, tungsten, tantalum, cobalt, nickel, tungsten silicide, tantalum silicide, cobalt silicide, and/or nickel silicide. According to some example embodiments, the gate electrodes 240 may also include polysilicon.

According to some example embodiments, the gate electrodes 240 may each include a plurality of layers. According to some example embodiments, the gate electrodes 240 may each include a first barrier layer 241, a second barrier layer 242, and/or a gate conductive layer 243. According to some example embodiments, the first barrier layer 241, the second barrier layer 242, and the gate conductive layer 243 may each include a different material. According to some example embodiments, the first and second barrier layers 241 and 242 may have a constant thickness. According to some example embodiments, the first and second barrier layers 241 and 242 may have a same thickness or a similar thickness to one another. According to some example embodiments, the first barrier layer 241 may include, but is not limited to, metal oxide (e.g., aluminum oxide), metal nitride, and/or metal oxynitride. According to some example embodiments, the second barrier layer 242 may include, but is not limited to, titanium nitride. According to some example embodiments, the gate conductive layer 243 may include, but is not limited to, tungsten.

According to some example embodiments, the first and second bit line contact vias 271 and 273, the upper conductive pattern 281, and/or the bit line BL, which will be described below, may include any one or more of the above materials of the gate electrodes 240 (e.g., tungsten, tantalum, cobalt, nickel, tungsten silicide, tantalum silicide, cobalt silicide, and/or nickel silicide).

According to some example embodiments, the first to third upper insulating films 261, 263, and 265 may be arranged on an uppermost gate electrode 240(SE). The first to third upper insulating films 261, 263, and 265 may include an insulating material (e.g., silicon oxide and/or the like).

According to some example embodiments, a plurality of channel structures 250 may penetrate the first upper insulating film 261, the gate electrodes 240, the insulating films 230, and/or the second and third semiconductor layers 201b and 201c in the first direction (the Z direction). According to some example embodiments, the plurality of channel structures 250 may be surrounded or partially surrounded by the first upper insulating film 261, the gate electrodes 240, the insulating films 230, and/or the second and third semiconductor layers 201b and 201c. According to some example embodiments, a bottom of the channel structures 250 may be surrounded or partially surrounded by the first semiconductor layer 201a. Thus, an upper surface of the channel structures 250 may be coplanar or substantially coplanar with the first upper insulating film 261 (e.g., with an upper surface of the first upper insulating film 261) and a lower surface of the channel structures 250 may be located at a lower level than an upper surface of the first semiconductor layer 201a. Adjacent channel structures 250 may be spaced apart from each other at predetermined or determined intervals in the second and third directions (the X and Y directions).

According to some example embodiments, the channel structures 250 may have a high aspect ratio. According to some example embodiments, the channel structures 250 may have a circular horizontal cross-sectional shape or an approximately circular horizontal cross-sectional shape, but are not limited thereto. According to some example embodiments, the channel structures 250 may include a tapered structure. Here, the channel structures 250 having the tapered structure means that a width of an upper portion of the channel structures 250 is greater than a width of a lower portion thereof.

According to some example embodiments, each of the channel structures 250 may include a plurality of layers. According to some example embodiments, the channel structures 250 may each include a gate insulating film 251, a channel layer 253, and/or a buried insulating film 255.

According to some example embodiments, the gate insulating film 251 may constitute a bottom surface and/or an outer side surface of each of the channel structures 250. According to some example embodiments, the gate insulating film 251 may insulate the channel layer 253 from the gate electrodes 240.

According to some example embodiments, the gate insulating film 251 may include a plurality of layers. According to some example embodiments, the gate insulating film 251 may include an upper gate insulating film 251u and a lower gate insulating film 251d. According to some example embodiments, the upper gate insulating film 251u and the lower gate insulating film 251d may be spaced apart from each other with the third semiconductor layer 201c therebetween. According to some example embodiments, the upper gate insulating film 251u may include an upper tunnel insulating film 251au, an upper charge storage film 251bu, and/or an upper charge blocking film 251cu. According to some example embodiments, the lower gate insulating film 251d may include a lower tunnel insulating film 251ad, a lower charge storage film 251bd, and/or a lower charge blocking film 251cd.

According to some example embodiments, the upper and lower tunnel insulating films 251au and 251ad may include silicon oxide, hafnium oxide, aluminum oxide, zirconium oxide, tantalum oxide, and/or the like. According to some example embodiments, the upper and lower tunnel insulating films 251au and 251ad may be formed by separating a tunnel insulating film 251a (see FIG. 7B) formed in a conformal form.

According to some example embodiments, the upper tunnel insulating film 251au may be in contact with the third semiconductor layer 201c. According to some example embodiments, a lower surface of the upper tunnel insulating film 251au may be in contact with the third semiconductor layer 201c. According to some example embodiments, a side surface of the upper tunnel insulating film 251au may be in contact with the channel layer 253 and/or the upper charge storage film 251bu. According to some example embodiments, a first side surface of the upper tunnel insulating film 251au may be in contact with the channel layer 253 and a second side surface of the upper tunnel insulating film 251au may be in contact with the upper charge storage film 251bu.

According to some example embodiments, the lower tunnel insulating film 251ad may be in contact with the third semiconductor layer 201c. According to some example embodiments, an upper surface of the lower tunnel insulating film 251ad may be in contact with the third semiconductor layer 201c. According to some example embodiments, a side surface of the lower tunnel insulating film 251ad may be in contact with the channel layer 253 and the lower charge storage film 251bd. According to some example embodiments, a first side surface of the lower tunnel insulating film 251ad may be in contact with the channel layer 253 and a second side surface of the lower tunnel insulating film 251ad may be in contact with the lower charge storage film 251bd.

According to some example embodiments, the upper and lower charge storage films 251bu and 251bd may include silicon nitride, boron nitride, silicon boron nitride, and/or polysilicon doped with impurities. According to some example embodiments, the upper and lower charge storage films 251bu and 251bd may each include a material having a high etch selectivity with respect to each of the upper and lower tunnel insulating films 251au and 251ad. For example, when the upper and lower tunnel insulating films 251au and 251ad include silicon oxide, the upper and lower charge storage films 251bu and 251bd may include silicon nitride, but are not limited thereto.

According to some example embodiments, the upper charge storage film 251bu may be a region in which electrons tunneling through the upper tunnel insulating film 251au from the channel layer 253 are stored. According to some example embodiments, since the upper charge storage film 251bu may be arranged at the same vertical level or a similar vertical level as the gate electrodes 240, charges for data storage may be stored by applying voltage to the gate electrodes 240. Since the lower charge storage film 251bd is arranged below the gate electrodes 240, charges for data storage may not be stored. According to some example embodiments, the upper and lower charge storage films 251*bu* and 251*bd* may be formed by separating a charge storage film 251*b* (see FIG. 7B) formed in a conformal form.

According to some example embodiments, the upper charge storage film 251*bu* may be between the upper tunnel insulating film 251*au* and the upper charge blocking film 251*cu*. According to some example embodiments, the upper charge storage film 251*bu* may be in contact with the upper tunnel insulating film 251*au* and the upper charge blocking film 251*cu*. According to some example embodiments, the upper charge storage film 251*bu* may be in contact with the second and third semiconductor layers 201*b* and 201*c*. According to some example embodiments, a lower surface of the upper charge storage film 251*bu* may be in contact with the third semiconductor layer 201*c*.

According to some example embodiments, the upper charge storage film 251*bu* may include an upper cover 251*buc* that protrudes horizontally toward the second semiconductor layer 201*b* at the same level (e.g., vertical level) as or a similar level to the second semiconductor layer 201*b*. The upper cover 251*buc* may be distinguished by a broken line shown in FIG. 1B. According to some example embodiments, the upper cover 251*buc* may be a portion of the upper charge storage film 251*bu* arranged below the upper charge blocking film 251*cu*. According to some example embodiments, the upper cover 251*buc* may be in contact with a side surface of the second semiconductor layer 201*b*. According to some example embodiments, the upper cover 251*buc* may be between upper and lower surfaces of the second semiconductor layer 201*b* (e.g., at a vertical level between upper and lower surfaces of the second semiconductor layer 201*b*). According to some example embodiments, the upper cover 251*buc* may cover a lower surface of the upper charge blocking film 251*cu*. According to some example embodiments, the upper cover 251*buc* may be in contact with the lower surface of the upper charge blocking film 251*cu*.

According to some example embodiments, the upper cover 251*buc* may protrude outwardly from a center of each of the channel structures 250 to have a generally circular symmetry, in a plan view. According to some example embodiments, the upper charge storage film 251*bu* may have a maximum or highest horizontal thickness (e.g., width) at the level (e.g., vertical level) at which the upper cover 251*buc* is formed. According to some example embodiments, a portion of each of the upper tunnel insulating film 251*au*, the upper charge storage film 251*bu*, and the upper charge blocking film 251*cu*, which is farther from the semiconductor layer 201 than the upper cover 251*buc*, may have a constant or substantially constant thickness (e.g., with respect to one another) in the first direction (the Z direction).

As described later in detail with respect to a method of manufacturing the semiconductor memory device 10, the process distribution of the upper charge blocking film 251*cu* may be controlled by the formation of the upper cover 251*buc*. Accordingly, it may be possible to prevent or reduce the formation of a parasitic transistor that may cut off a current path through the channel layer 253, and thus, the reliability of the semiconductor memory device 10 may be improved.

According to some example embodiments, the lower charge storage film 251*bd* may be between the lower tunnel insulating film 251*ad* and the lower charge blocking film 251*cd*. According to some example embodiments, the lower charge storage film 251*bd* may be in contact with the lower tunnel insulating film 251*ad* and the lower charge blocking film 251*cd*. According to some example embodiments, the lower charge storage film 251*bd* may be in contact with the first and third semiconductor layers 201*a* and 201*c*. According to some example embodiments, an upper surface of the lower charge storage film 251*bd* may be in contact with the third semiconductor layer 201*c*.

According to some example embodiments, the lower charge storage film 251*bd* may include a lower cover 251*bdc* that protrudes horizontally toward the first semiconductor layer 201*a* at the same level (e.g., vertical level) as or a similar level to the first semiconductor layer 201*a*. The lower cover 251*bdc* may be distinguished by a broken line shown in FIG. 1B. According to some example embodiments, the lower cover 251*bdc* may be a portion of the lower charge storage film 251*bd* arranged on the lower charge blocking film 251*cd*. According to some example embodiments, the lower cover 251*bdc* may be in contact with a side surface of the first semiconductor layer 201*a*. According to some example embodiments, the lower cover 251*bdc* may be located below (e.g., at a vertical level below) an upper surface of the first semiconductor layer 201*a*. According to some example embodiments, the lower cover 251*bdc* may cover an upper surface of the lower charge blocking film 251*cd*. According to some example embodiments, the lower cover 251*bdc* may be in contact with the upper surface of the lower charge blocking film 251*cd*.

According to some example embodiments, the lower cover 251*bdc* may protrude outwardly from the center of each of the channel structures 250 to have a generally circular symmetry, in a plan view. In addition, the lower charge blocking film 251*cd* may have a maximum or highest horizontal thickness (e.g., width) at the level (e.g., vertical level) at which the lower cover 251*bdc* is formed. According to some example embodiments, a portion of each of the lower tunnel insulating film 251*ad*, the lower charge storage film 251*bd*, and the lower charge blocking film 251*cd*, which are closer to the semiconductor layer 201 than the upper cover 251*buc*, may have a constant or substantially constant thickness (e.g., with respect to one another) in the first direction (the Z direction).

According to some example embodiments, the upper and lower charge blocking films 251*cu* and 251*cd* may include a single film or a multilayer film from among silicon oxide, silicon nitride, hafnium oxide, aluminum oxide, zirconium oxide, tantalum oxide, and/or the like. However, they are not limited thereto, and the upper and lower charge blocking films 251*cu* and 251*cd* may include a dielectric material having a high dielectric constant. According to some example embodiments, the upper and lower charge blocking films 251*cu* and 251*cd* may include a material having a high etch selectivity with respect to the upper and lower charge storage films 251*bu* and 251*bd*. For example, when the upper and lower charge storage films 251*bu* and 251*bd* include silicon nitride, the upper and lower charge blocking films 251*cu* and 251*cd* may include silicon oxide. According to some example embodiments, the upper and lower charge blocking films 251*cu* and 251*cd* may be formed by separating a charge blocking film 251*c* (see FIG. 7B) formed in a conformal form.

According to some example embodiments, the upper charge blocking film 251*cu* and the lower charge blocking film 251*cd* may define outer boundaries of the channel structures 250. According to some example embodiments, the upper charge blocking film 251*cu* may be in contact with the insulating films 230 and the gate electrodes 240. In some cases, the insulating films 230 and the upper charge blocking film 251*cu* may include the same or substantially the same material, and thus, the insulating films 230 and the upper charge blocking film 251cu may be integrated to form a continuous structure. However, they are not limited thereto, and the insulating films 230 and the upper charge blocking film 251cu may include different materials, and thus, the insulating films 230 and the upper charge blocking film 251cu may be separate from each other.

According to some example embodiments, an inner side surface of the upper charge blocking film 251cu may be in contact with the upper charge storage film 251bu. According to some example embodiments, an outer side surface of the upper charge blocking film 251cu may be in contact with the second semiconductor layer 201b. Here, the inner side surface of the upper charge blocking film 251cu may mean a side surface most adjacent to the channel layer 253 and the outer side surface of the upper charge blocking film 251cu may mean a side surface most adjacent to the gate electrodes 240. According to some example embodiments, the upper charge blocking film 251cu may be in contact with a side wall of the second semiconductor layer 201b. According to some example embodiments, the upper charge blocking film 251cu may be in contact with only the second semiconductor layer 201b (e.g., among the first through third semiconductor layers 201a, 201b and 201c). According to some example embodiments, the upper charge blocking film 251cu may not be in contact with the third semiconductor layer 201c. According to some example embodiments, the upper charge blocking film 251cu may be spaced apart from the third semiconductor layer 201c with the upper charge storage film 251bu (more specifically, the upper cover 251buc) therebetween.

According to some example embodiments, the lower charge blocking film 251cd may be in contact with the first semiconductor layer 201a. According to some example embodiments, the lower charge blocking film 251cd may be in contact with a side wall of the first semiconductor layer 201a. According to some example embodiments, the lower charge blocking film 251cd may be in contact with only the first semiconductor layer 201a (e.g., among the first through third semiconductor layers 201a, 201b and 201c). According to some example embodiments, the lower charge blocking film 251cd may not contact the third semiconductor layer 201c. According to some example embodiments, the lower charge blocking film 251cd may be spaced apart from the third semiconductor layer 201c with the lower charge storage film 251bd (more specifically, the lower cover 251bdc) therebetween.

According to some example embodiments, a lower surface profile of each of the upper tunnel insulating film 251au, the upper charge storage film 251bu, and the upper charge blocking film 251cu may include a round shape. However, it is not limited thereto, and a portion of the lower surface profiles of the upper tunnel insulating film 251au, the upper charge storage film 251bu, and the upper charge blocking film 251cu may include a linear shape or a polygonal shape. According to some example embodiments, an upper surface profile of each of the lower tunnel insulating film 251ad, the lower charge storage film 251bd, and the lower charge blocking film 251cd may include a round shape. However, it is not limited thereto, and a portion of the upper surface profiles of the lower tunnel insulating film 251ad, the lower charge storage film 251bd, and the lower charge blocking film 251cd may include a linear shape or a polygonal shape.

According to some example embodiments, the third semiconductor layer 201c may be in contact with the channel layer 253. According to some example embodiments, portions of the third semiconductor layer 201c that are in contact with the upper tunnel insulating film 251au, the upper charge storage film 251bu, the lower tunnel insulating film 251ad, and the lower charge storage film 251bd may include a round profile, but are not limited thereto. As described later, the third semiconductor layer 201c may be formed by removing a portion of the gate insulating film 251 and a sacrificial semiconductor layer 202 (see FIG. 5) and growing a semiconductor material (for example, polysilicon) on removed portions thereof. Therefore, the lower surface profiles of the upper tunnel insulating film 251au and the upper charge storage film 251bu, and the upper surface profiles of the lower tunnel insulating film 251ad and the lower charge storage film 251bd may be transferred to the third semiconductor layer 201c. Accordingly, the third semiconductor layer 201c may include any complementary profile corresponding to the lower surface profiles of the upper tunnel insulating film 251au and the upper charge storage film 251bu, and the upper surface profiles of the lower tunnel insulating film 251ad and the lower charge storage film 251bd.

According to some example embodiments, the third semiconductor layer 201c may include two discontinuous positions on the lower and upper surface profiles, since the third semiconductor layer 201c may contact the upper and lower tunnel insulating films 251au and 251ad and the upper and lower charge storage films 251bu and 251bd, but the third semiconductor layer 201c may not contact the upper and lower charge blocking films 251cu and 251cd. According to some example embodiments, a profile of the third semiconductor layer 201c may be discontinuously changed at i) a boundary between the upper tunnel insulating film 251au and the upper charge storage film 251bu, ii) a boundary between the upper charge storage film 251bu and the second semiconductor layer 201b, iii) a boundary between the lower tunnel insulating film 251ad and the lower charge storage film 251bd, and iv) a boundary between the lower charge storage film 251bd and the first semiconductor layer 201a.

According to some example embodiments, the channel layer 253 may fill a portion of an inner space defined by the gate insulating film 251. The channel layer 253 formed on an inner wall of the gate insulating film 251 may have a constant or substantially constant thickness. According to some example embodiments, a buried insulating film 255 may be filled in a space defined by the channel layer 253. An upper surface of the buried insulating film 255 may be covered by an upper portion of the channel layer 253. According to some example embodiments, the upper portion of the channel layer 253 may have a greater thickness than a sidewall of the channel layer 253 to form a contact with the first bit line contact via 271. According to some example embodiments, an upper surface of the channel layer 253 may serve as a contact pad for the first bit line contact via 271.

According to some example embodiments, a word line cut (WLC) may penetrate the first and second upper insulating films 261 and 263, the gate electrodes 240 and/or the insulating films 230 in the first direction (the Z direction). The word line cut (WLC) may extend in the second direction (the X direction). A length of the word line cut (WLC) in the second direction (the X direction) may be greater than a length of the gate electrodes 240 in the second direction (the X direction). According to some example embodiments, the word line cut (WLC) may extend in the second direction (the X direction) to separate the gate electrodes 240 in a horizontal direction (e.g., the third direction (the Y direction)). Thus, the gate electrodes 240 horizontally spaced apart from each other may act as gates of different transistors.

According to some example embodiments, the word line cut (WLC) may penetrate the second and third semiconductor layers 201b and 201c. According to some example embodiments, the word line cut (WLC) may extend to an upper portion of the first semiconductor layer 201a. According to some example embodiments, some of the word line cut (WLC) may extend in the first direction (the Z direction) to penetrate the opening 201op formed in the third semiconductor layer 201c. Accordingly, some of the word line cut (WLC) may be covered by the support connection structure 201b1 and thus may be spaced apart from the third semiconductor layer 201c. Here, some of the word line cut (WLC) being spaced apart from the third semiconductor layer 201c may mean that some of the word line cut (WLC) may not penetrate the third semiconductor layer 201c. Alternatively, the fact that some of the word line cut (WLC) may be spaced apart from the third semiconductor layer 201c may mean that the third upper insulating film 265 filling some of the word line cut (WLC) may not be in contact with the third semiconductor layer 201c with the second semiconductor layer 201b therebetween.

A string selection line cut (SLC) may extend in the first direction (the Z direction). According to some example embodiments, the string selection line cut (SLC) may penetrate uppermost and second-uppermost gate electrodes 240 (SE) in the first direction (the Z direction). A length in the second direction (the X direction) of the string selection line cut (SLC) may be greater than a length in the second direction (the X direction) of the uppermost and second-uppermost gate electrodes 240 (SE). Accordingly, the string selection line cut (SLC) may horizontally separate the uppermost and second-uppermost gate electrodes 240 (SE). According to some example embodiments, the first upper insulating film 261 may fill a space defined by the string selection line cut (SLC). The first upper insulating film 261 may insulate the uppermost and second-uppermost gate electrodes 240 (SE), which are spaced apart from each other at the same level (e.g., vertical level) or a similar level in the second direction (the Y direction). Accordingly, the uppermost and second-uppermost gate electrodes 240 (SE) horizontally spaced apart from each other may act as gates of different transistors.

The third upper insulating film 265 may be disposed on the second upper insulating film 263. The third upper insulating film 265 may include an insulating material. According to some example embodiments, an inside of the word line cut (WLC) may be filled by the third upper insulating film 265. Accordingly, the different gate electrodes 240 arranged at the same vertical level or a similar vertical level may be insulated from each other by the third upper insulating film 265. According to some example embodiments, the first and second bit line contact vias 271 and 273 may be covered by the third upper insulating film 265.

According to some example embodiments, the first and second bit line contact vias 271 and 273 may extend in the first direction (the Z direction). According to some example embodiments, the first bit line contact via 271 may further penetrate the second upper insulating film 263. According to some example embodiments, the first bit line contact via 271 may be in contact with the channel layer 253.

According to some example embodiments, an upper conductive pattern 281 may be arranged between the first and second bit line contact vias 271 and 273. According to some example embodiments, the upper conductive pattern 281 may extend in the horizontal direction (e.g., the second direction (the X direction) and/or the third direction (the Y direction)). According to some example embodiments, the upper conductive pattern 281 may be in contact with the first and second bit line contact vias 271 and 273. According to some example embodiments, the bit line BL may be in contact with the second bit line contact via 273.

According to some example embodiments, the channel structures 250 may be connected to the bit line BL via the first bit line contact via 271, the upper conductive pattern 281 and/or the second bit line contact via 273.

Figure 2:
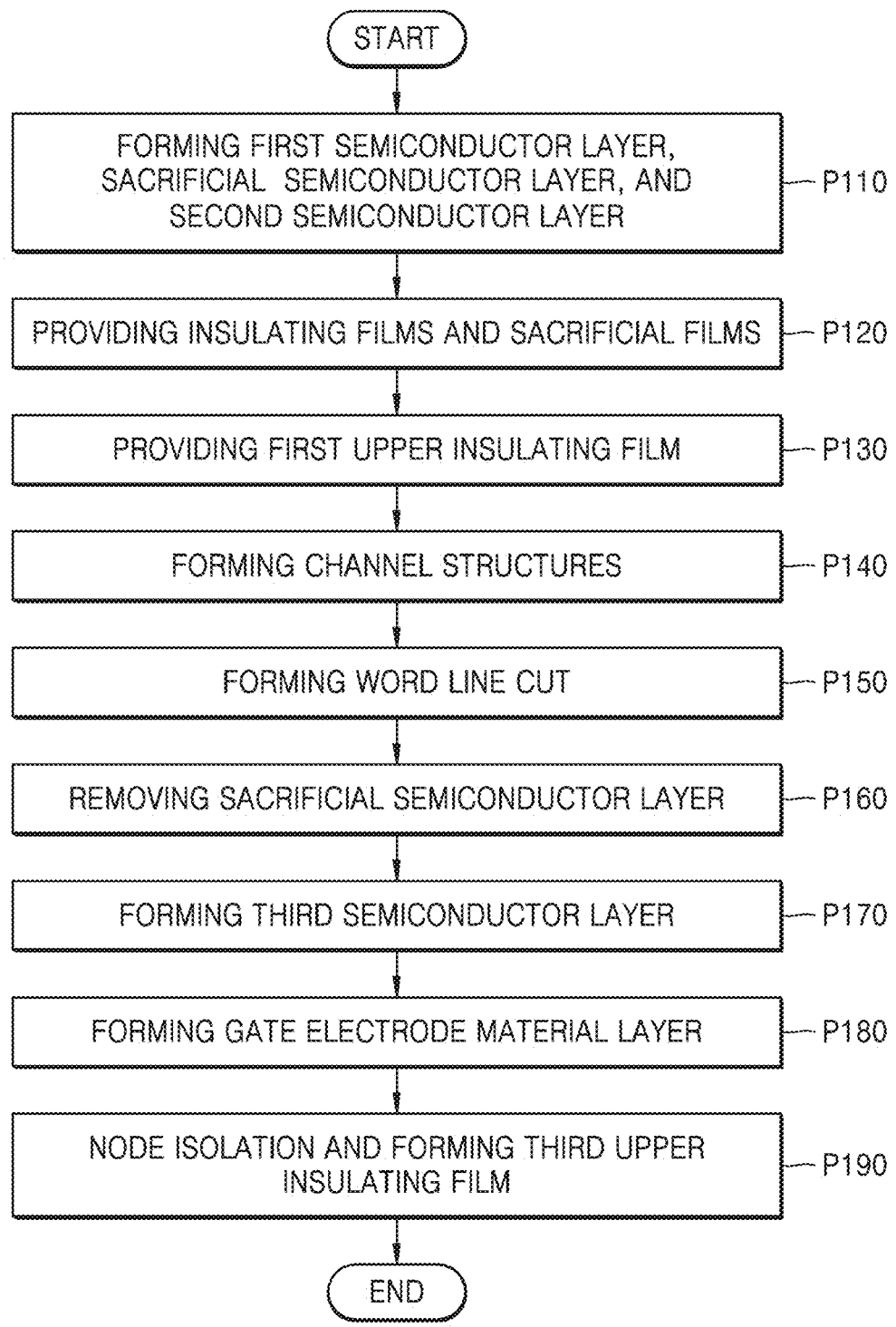
FIGS. 2 and 3 are flowcharts for explaining a semiconductor memory device according to some example embodiments.
Figure 3:
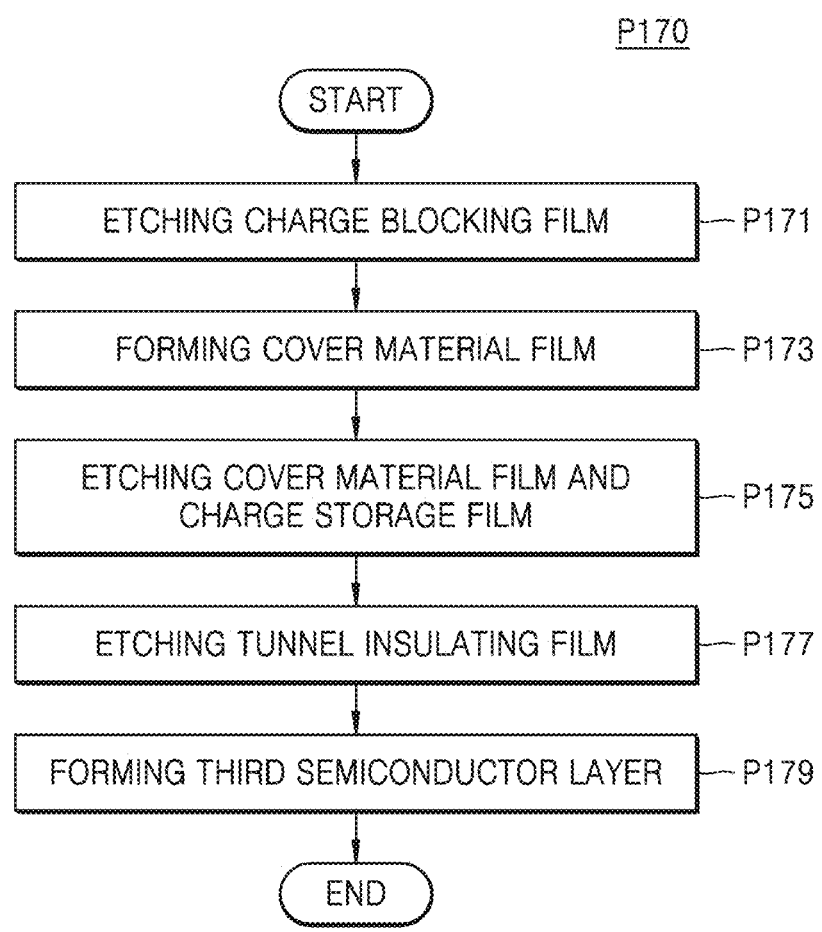

FIGS. 2 and 3 are flowcharts for explaining a method of manufacturing a semiconductor memory device according to some example embodiments.

FIGS. 4 to 13 are cross-sectional views for explaining a method of manufacturing a semiconductor memory device according to some example embodiments. In the discussion regarding FIGS. 4 to 13 below, the term "provide" may refer to providing, obtaining and/or forming.

Figure 4:
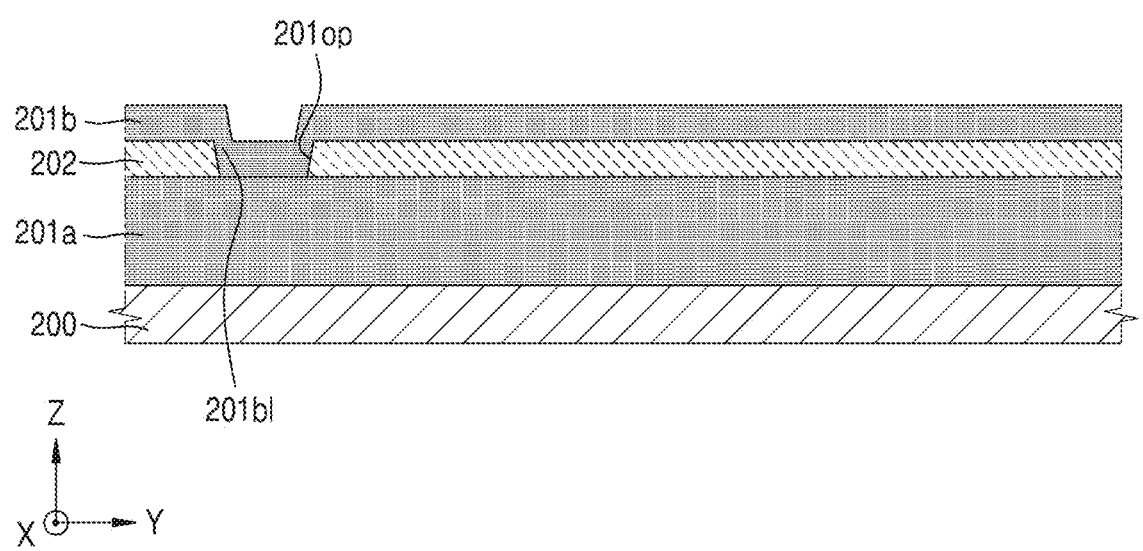
FIGS. 4 to 13 are cross-sectional views for explaining a method of manufacturing a semiconductor memory device according to some example embodiments.

Referring to FIGS. 2 and 4, the first semiconductor layer 201a, the sacrificial semiconductor layer 202, and the second semiconductor layer 201b may be formed at P110.

After providing the conductive flat plate 200, the first semiconductor layer 201a may be provided. The conductive flat plate 200 and/or the first semiconductor layer 201a may be formed by a chemical vapor deposition process, an atomic layer deposition process, a physical vapor deposition process, and/or the like.

The sacrificial semiconductor layer 202 may be provided on the first semiconductor layer 201a and then a portion of the sacrificial semiconductor layer 202 may be patterned to form the opening 201op for partially exposing a portion of the upper surface of the first semiconductor layer 201a. According to some example embodiments, the opening 201op may extend in the second direction (the X direction), but is not limited thereto. Then, the second semiconductor layer 201b may be provided conformally over the first semiconductor layer 201a and the sacrificial semiconductor layer 202. The second semiconductor layer 201b may include the support connection structure 201b1 in contact with the first semiconductor layer 201a at the opening 201op. According to some example embodiments, the first and second semiconductor layers 201a and 201b may include doped polysilicon.

According to some example embodiments, the sacrificial semiconductor layer 202 may include an insulating material. According to some example embodiments, the sacrificial semiconductor layer 202 may include any one from among silicon oxide, silicon nitride, and/or silicon oxynitride. According to some example embodiments, the sacrificial semiconductor layer 202 may have a high etch selectivity with respect to the insulating films 230 (see FIG. 5) described below.

Figure 5:
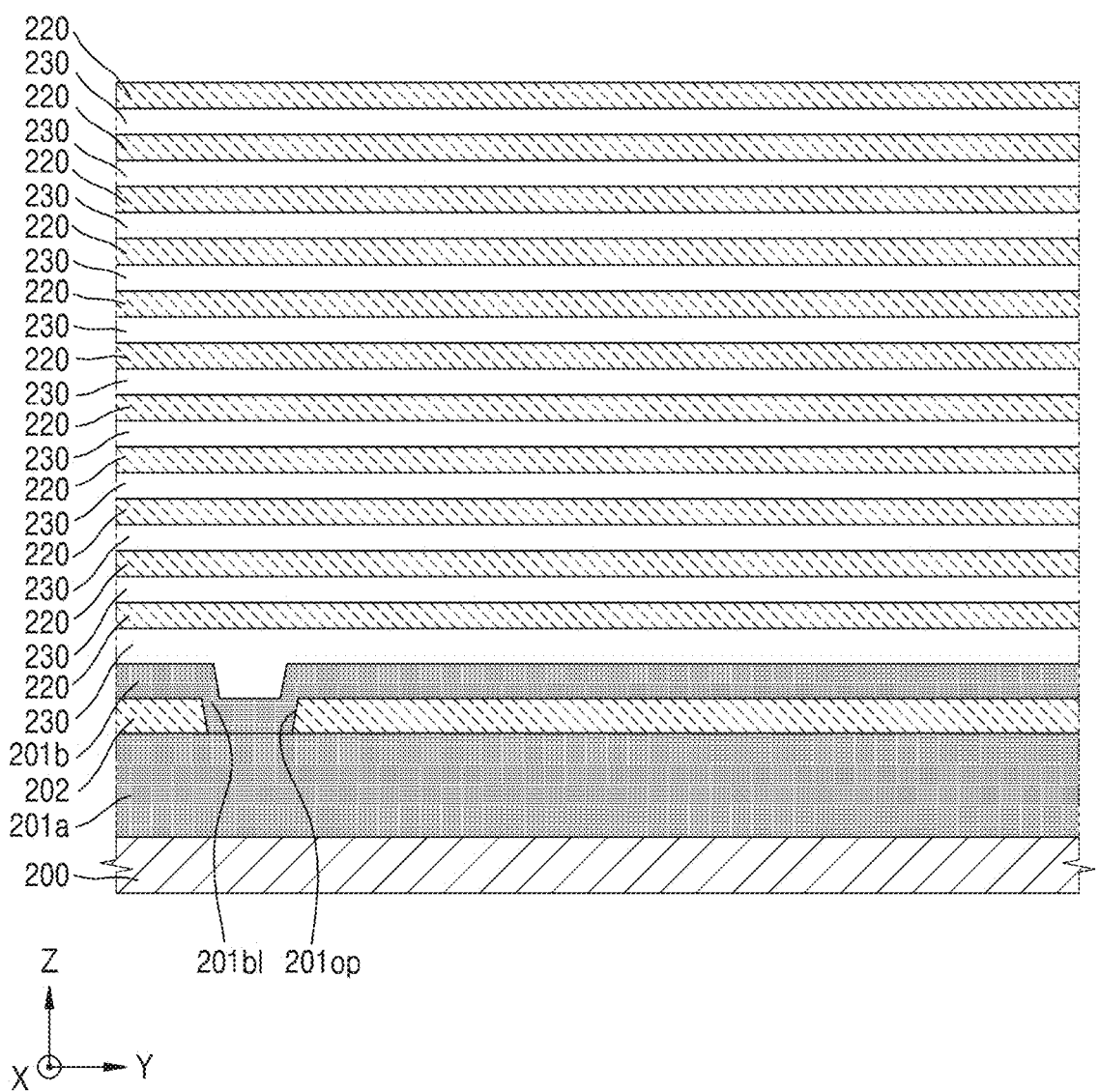

Referring to FIGS. 2 and 5, the insulating films 230 and the sacrificial films 220 may be provided at P120.

According to some example embodiments, the sacrificial films 220 and the insulating films 230 may be alternately stacked on the second semiconductor layer 201b. According to some example embodiments, the insulating films 230 and the sacrificial films 220 may include different materials. According to some example embodiments, the insulating films 230 and the sacrificial films 220 may each have a high etch selectivity with respect to each other. For example, when the sacrificial films 220 include silicon oxide, the insulating films 230 may include silicon nitride. As another example, when the sacrificial films 220 include silicon nitride, the insulating films 230 may include silicon oxide. As another example, when the sacrificial films 220 include undoped polysilicon, the insulating films 230 may include silicon nitride or silicon oxide.

Figure 6:
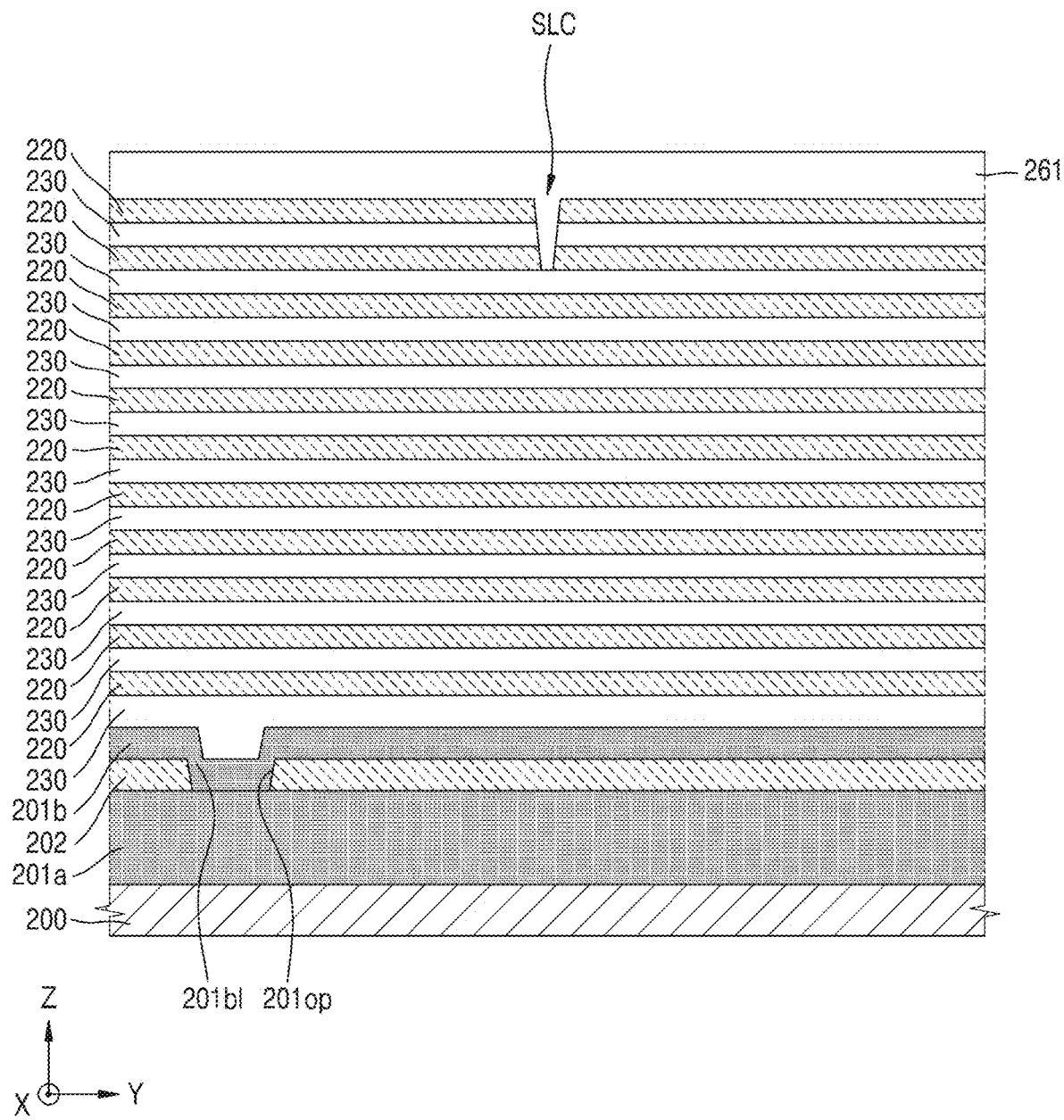

Referring to FIGS. 2 and 6, the first upper insulating film 261 may be provided at P130.

Providing the first upper insulating film 261 may include forming the string selection line cut (SLC), providing an insulating material, and then planarizing the insulating material. According to some example embodiments, the string selection line cut (SLC) may be formed by a dry etching process so that two layers of the sacrificial films 220 located farthest from the second semiconductor layer 201b are horizontally separated from each other. Subsequently, after providing the insulating material sufficiently to fill the string selection line cut (SLC), the provided insulating material may be planarized to form the first upper insulating film 261.

Figure 7A:
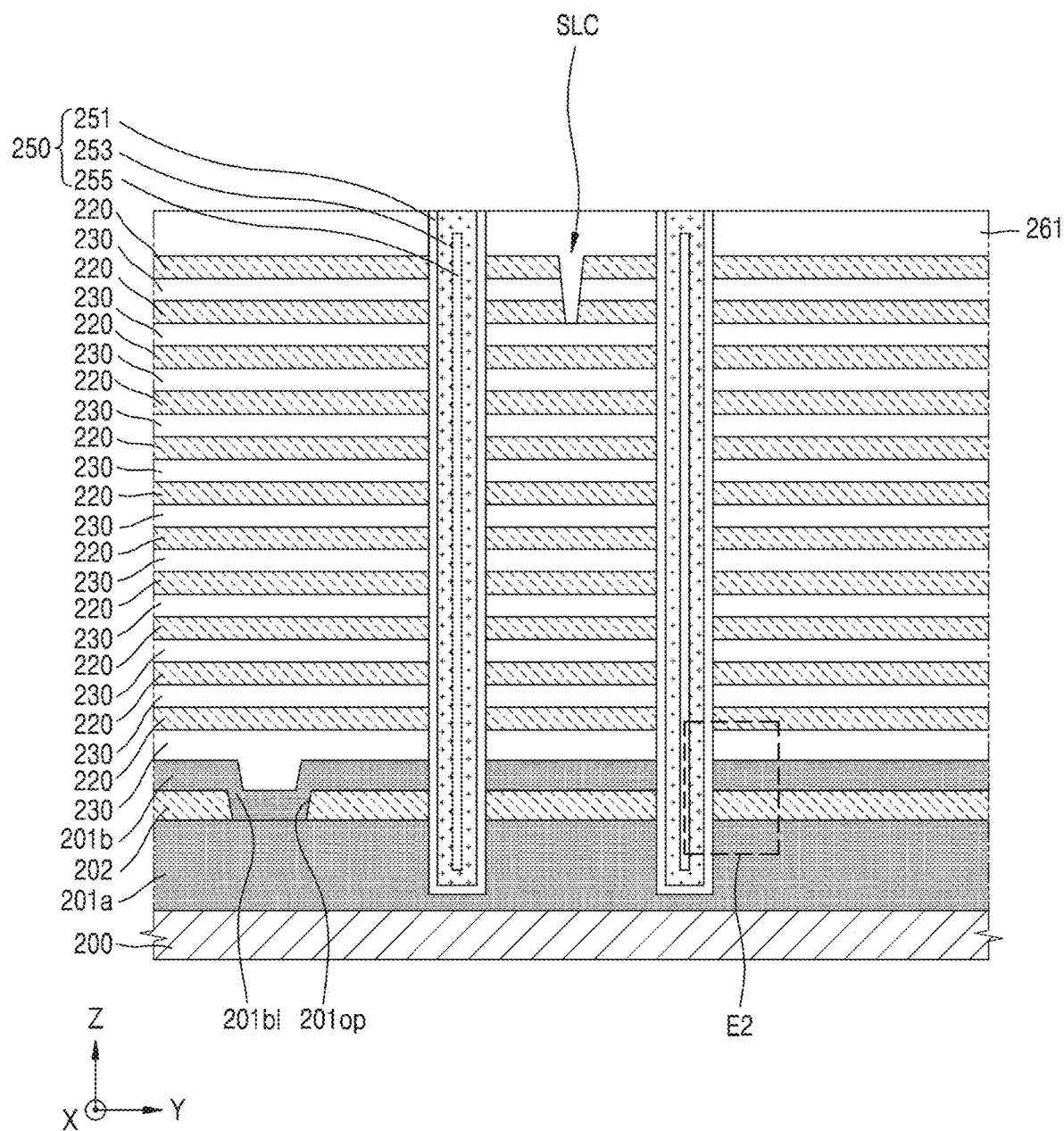
Figure 7B:
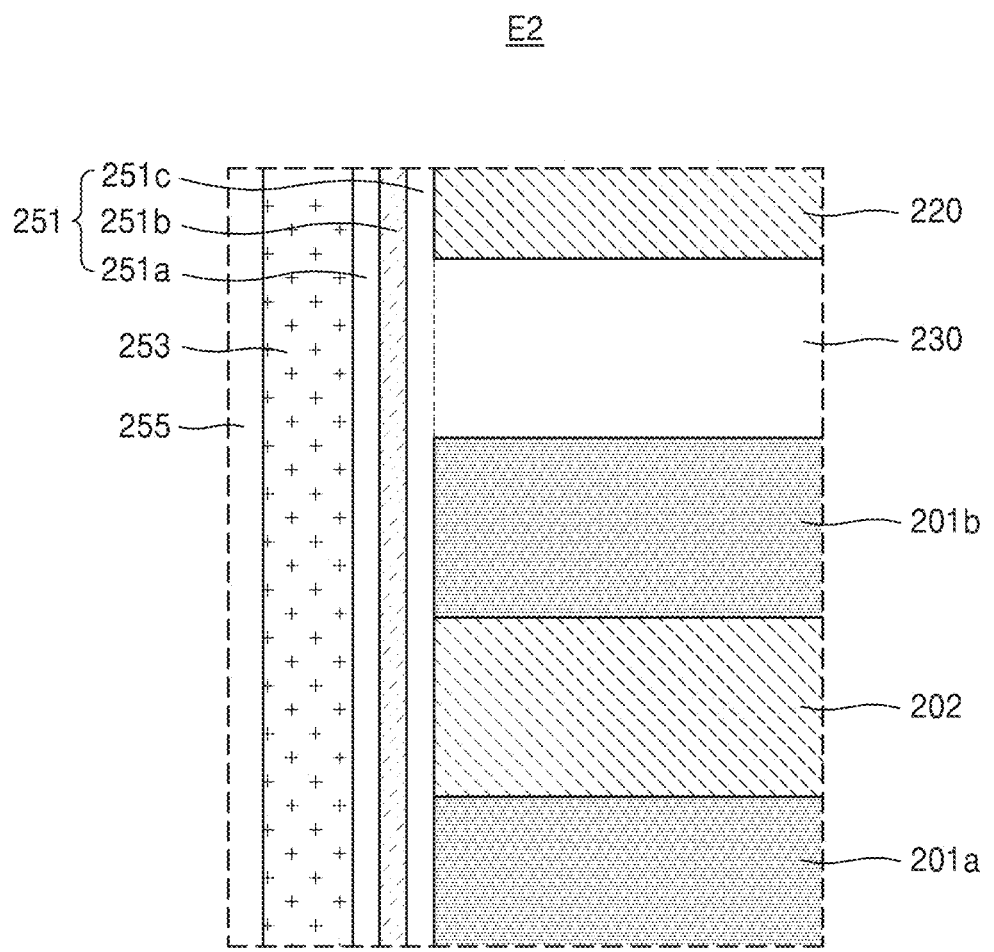

Referring to FIGS. 2, 7A, and 7B, the channel structures 250 may be formed at P140. Here, FIG. 7B is a partial enlarged cross-sectional view of E2 of FIG. 7A. In order to form the channel structures 250, after providing a photoresist material layer on the insulating films 230 and the sacrificial films 220 alternately stacked, an exposure and development process and an etching process may be sequentially performed to form channel holes penetrating the upper insulating film 261, a stacked structure of the sacrificial films 220 and the insulating films 230, the second semiconductor layer 201b, the sacrificial semiconductor layer 202, and/or an upper portion of the first semiconductor layer 201a.

Then, a gate insulating material film, a channel material film, and/or a buried insulating material film, which each fill at least a portion of the channel holes, may be sequentially and conformally provided. According to some example embodiments, the gate insulating material film may include a charge blocking material film, a charge storage material film, and a tunnel insulating material film which are sequentially provided. And then, by performing an etch back process, an upper surface of the first upper insulating film 261 may be exposed. Next, after further removing an upper portion of the buried insulating material film in the channel holes, the same material as or a similar material to the channel material film may be deposited so as to cover an upper portion of the buried insulating film 255. Accordingly, a kind of pad for contact with the first bit line contact via 271 (see FIG. 1A) may be formed.

Accordingly, the channel structures 250 including the gate insulating film 251, the channel layer 253, and the buried insulating film 255 may be formed. The gate insulating film 251 may include the tunnel insulating film 251a, the charge storage film 251b, and the charge blocking film 251c.

Figure 8:
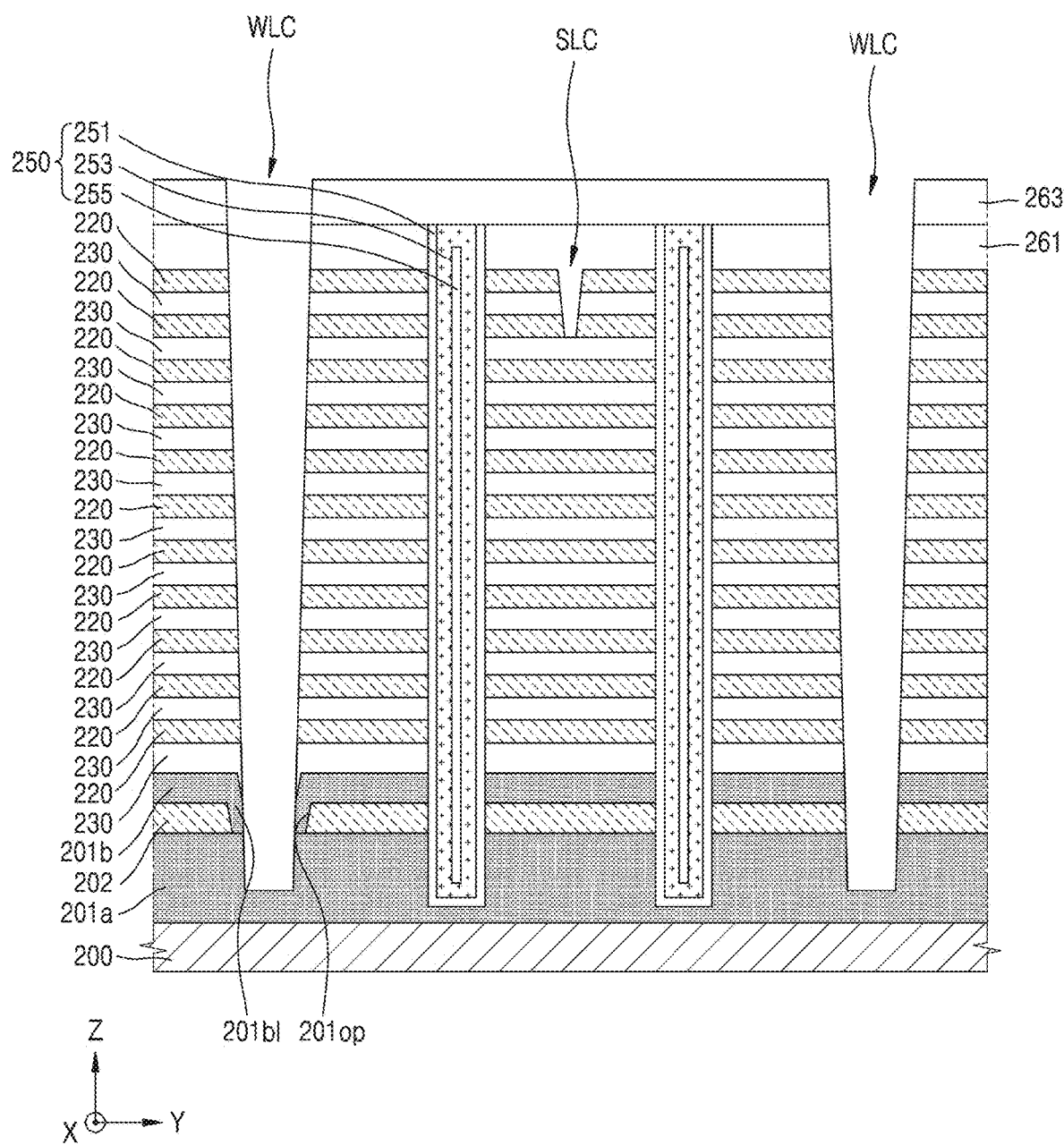

Referring to FIGS. 2 and 8, the word line cut (WLC) may be formed at P150. According to some example embodiments, the second upper insulating film 263 covering the upper surface of the channel structures 250 and an upper surface of the first upper insulating film 261, and a hard mask pattern may be sequentially provided on the result of FIG. 7B, and then the second and first upper insulating films 263 and 261, the sacrificial films 220 and the insulating films 230, the second semiconductor layer 201b, the sacrificial semiconductor layer 202, and/or the first semiconductor layer 201a may be etched by using the hard mask pattern as an etch mask.

After forming the word line cut (WLC), the hard mask pattern may be removed. According to some example embodiments, the word line cut (WLC) may include a tapered shape in the first direction (the Z direction). According to some example embodiments, a length of the word line cut (WLC) in the second direction (the X direction) may be longer than a length of each of the sacrificial films 220 in the second direction (the X direction). Accordingly, the word line cut (WLC) may horizontally separate the sacrificial films 220 from each other.

According to some example embodiments, some of the word line cuts (WLCs) may vertically overlap with the opening 201op. According to some example embodiments, some of the word line cuts (WLCs) may extend through the opening 201op in the first direction (the Z direction). Accordingly, according to some example embodiments, some of the word line cuts (WLCs) may penetrate the support connection structure 201b1 and may not contact the sacrificial semiconductor layer 202.

Figure 9A:
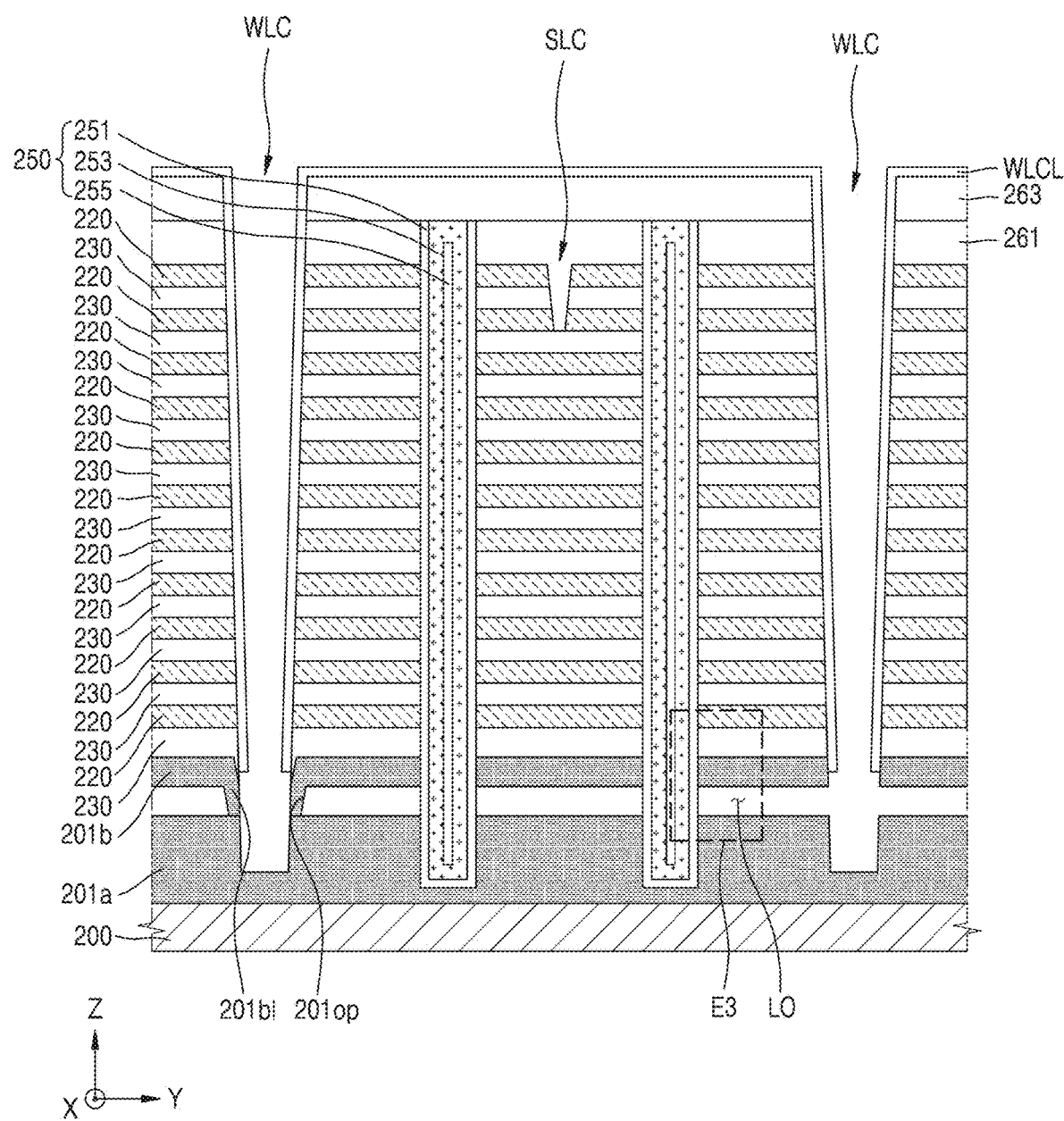
Figure 9B:
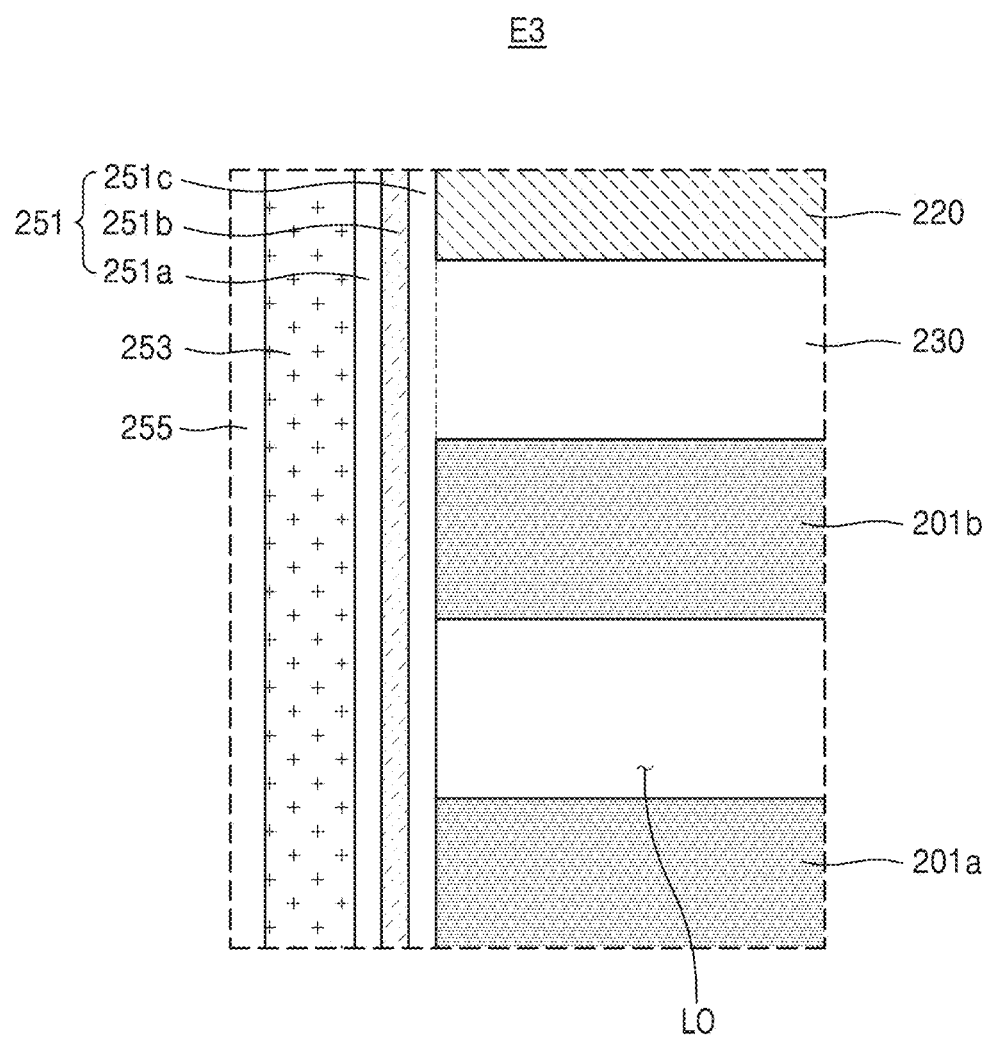

Referring to FIGS. 2, 8, 9A and 9B, the sacrificial semiconductor layer 202 may be removed at P160. Here, FIG. 9B is a partial enlarged cross-sectional view of an E3 of FIG. 9A.

According to some example embodiments, after providing a word line cut liner material layer on a structure in which the word line cut (WLC) is formed, a portion of the word line cut liner material layer may be removed to expose at least a portion of the sacrificial semiconductor layer 202 located at a lower portion of the world line cut (WLC), thereby forming a word line cut liner (WLCL). The word line cut liner (WLCL) may include a material having a high etch selectivity with respect to the sacrificial semiconductor layer 202. The word line cut liner (WLCL) may expose the sacrificial semiconductor layer 202, while covering the sacrificial films 220. The word line cut liner (WLCL) may act as a layer for protecting the sacrificial films 220 in a process of removing the sacrificial semiconductor layer 202.

Since the first semiconductor layer 201a may be connected to the second semiconductor layer 201b via the support connection structure 201b1, even when the sacrificial semiconductor layer 202 may be removed, the insulating films 230 and the sacrificial films 220 may be prevented from collapsing or the occurrence of collapse may be reduced.

A space formed by removing the sacrificial semiconductor layer 202 may be referred to as a side opening (LO). After removing the sacrificial semiconductor layer 202, the word line cut liner (WLCL) may be removed.

Referring to FIGS. 2, 3 and 10A to 11B, the third semiconductor layer may be formed at P170. Here, FIGS. 10A to 10D are partial cross-sectional views corresponding to E3 in FIG. 9A.

The formation of the third semiconductor layer at P170 may include the operations of etching the charge blocking film 251c (see FIG. 9B) at P171, depositing (e.g., forming) a cover material film 251bc at P173, etching the cover material film 251bc and the charge storage film 251b at P175, etching the tunnel insulating film 251a at P177, and then providing the third semiconductor layer 201c at P179.

Figure 10A:
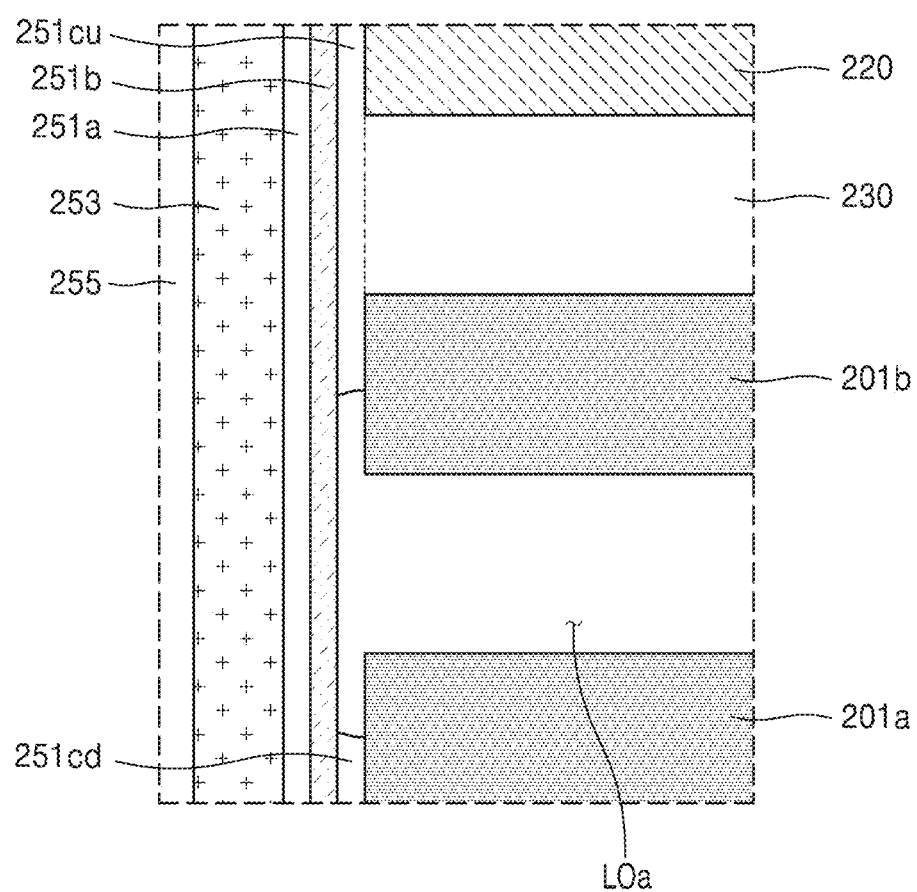

More specifically, referring to FIGS. 3 and 10A, the charge blocking film 251c (see FIG. 9B) may be etched at P171.

According to some example embodiments, the charge blocking film 251c (see FIG. 9B) may be wet etched. According to some example embodiments, the charge blocking film 251c (see FIG. 9B) may be partially etched by an etchant, which has a low etch rate with respect to the charge storage film 251b and has a high etch rate with respect to the charge blocking film 251c (see FIG. 9B). Accordingly, the charge blocking film 251c (see FIG. 9B) may be separated to form the upper and lower charge blocking films 251cu and 251cd. A side opening LO (see FIG. 9A) may be enlarged by etching the charge blocking film 251c (see FIG. 9B) to form a first side opening LOa. The upper and lower charge blocking films 251cu and 251cd may be formed by an wet etching process, and thus may have a round profile on each of bottom surfaces of the upper and lower charge blocking films 251cu and 251cd, but are not limited thereto.

Figure 10B:
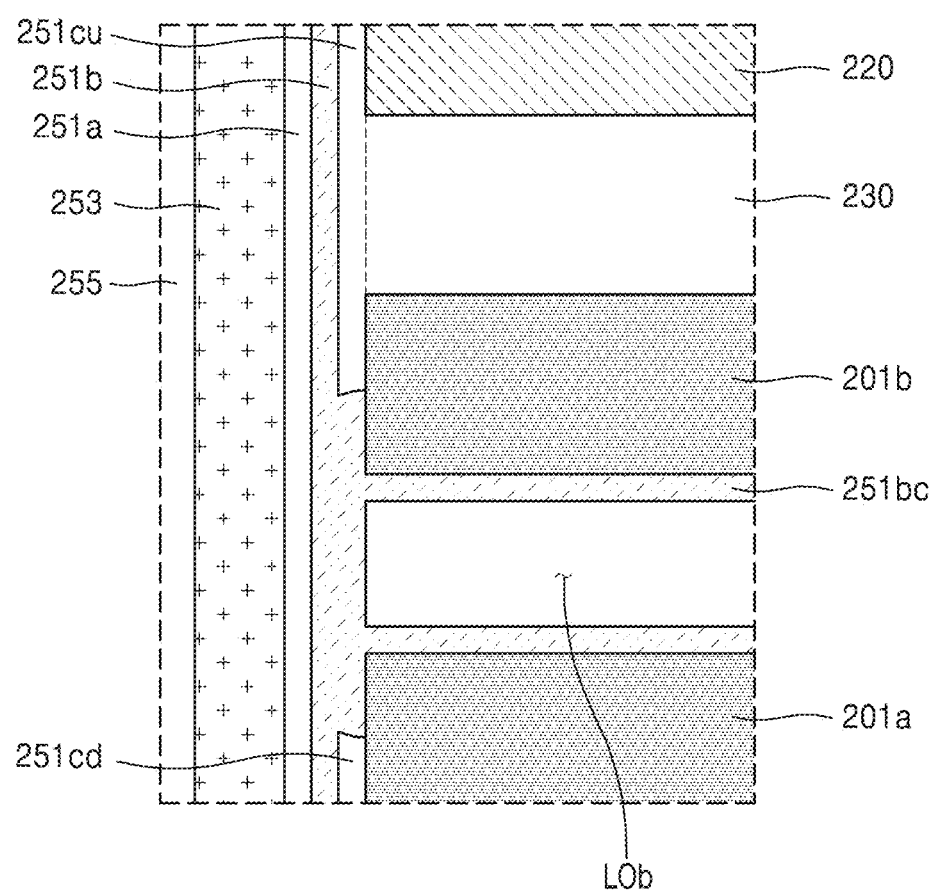

Referring to FIGS. 3 and 10B, the cover material film 251bc may be provided at P173. According to some example embodiments, the cover material film 251bc may include, but is not limited thereto, the same material as or a similar material to the charge storage film 251b. According to some example embodiments, when the cover material film 251bc and the charge storage film 251b include the same material or a similar material, the cover material film 251bc may be integrated in a body so that the charge storage film 251b and the cover material film 251bc constitute a continuous structure. According to some example embodiments, the cover material film 251bc may cover the upper and lower charge blocking films 251cu and 251cd. According to some example embodiments, the cover material film 251bc may be provided by various methods such as a chemical vapor deposition method, an atomic layer deposition method, and the like. According to some example embodiments, by providing the cover material film 251bc, the first side opening LOa in FIG. 10A may reduce to form a second side opening LOb.

Figure 10C:
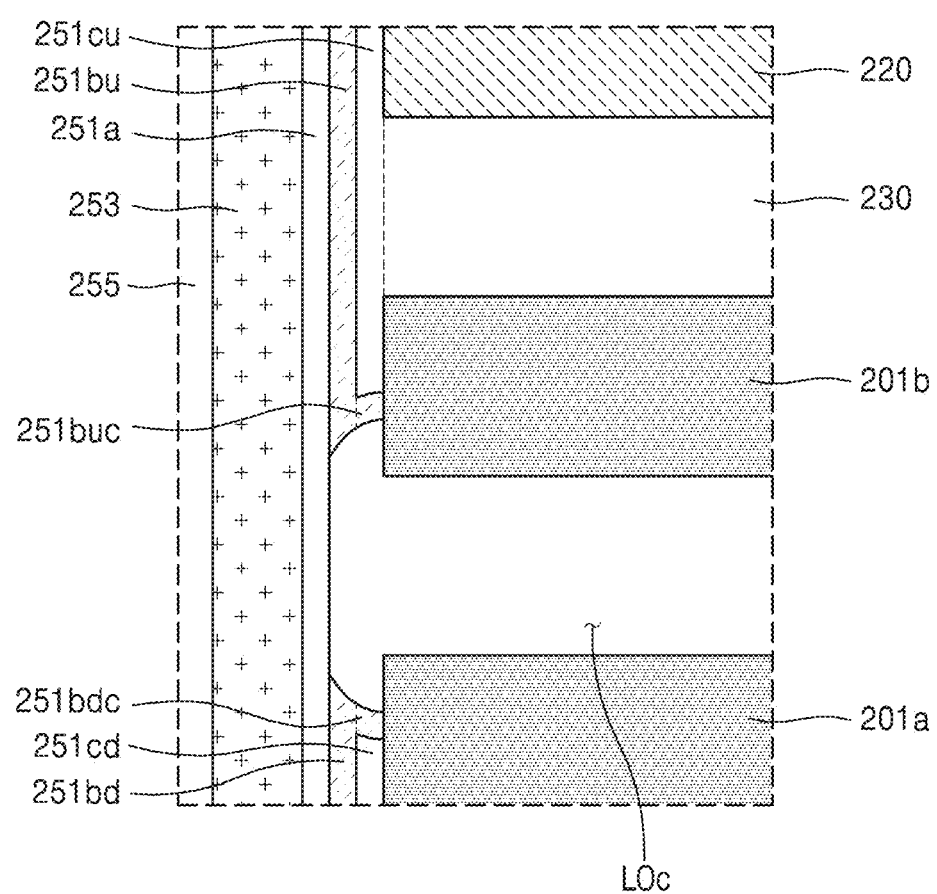

Referring to FIGS. 3, 10B and 10C, portions of the cover material film 251bc and the charge storage film 251b may be etched at P175.

According to some example embodiments, the cover material film 251bc and the charge storage film 251b may be etched by the wet etching process. According to some example embodiments, the cover material film 251bc and the charge storage film 251b may be partially removed by using an etchant that has a low etch rate with respect to the tunnel insulating film 251a and has a high etch rate with respect to the cover material film 251bc and the charge storage film 251b. Accordingly, the upper charge storage film 251bu including the upper cover 251buc and the lower charge storage film 251bd including the lower cover 251bdc may be formed. According to some example embodiments, by etching the charge storage film 251b, the second side opening LOb may expand to form a third side opening LOc.

Figure 10D:
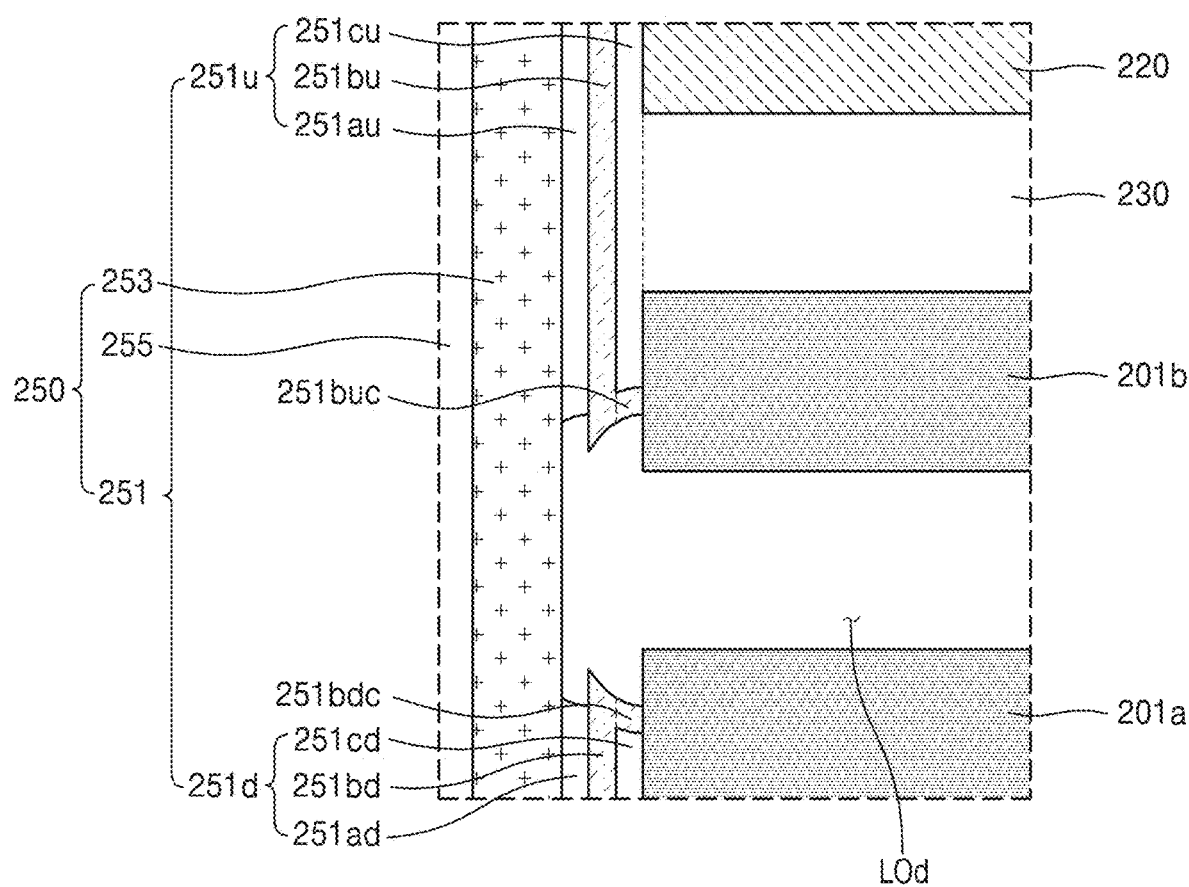

Referring to FIGS. 3, 10C and 10D, the tunnel insulating film 251a may be etched at P177.

According to some example embodiments, the tunnel insulating film 251a may be wet etched. According to some example embodiments, the tunnel insulating film 251a may be partially removed by using an etchant that has a low etch rate with respect to the upper and lower charge storage films 251bu and 251bd and has a high etch rate with respect to the tunnel insulating film 251a. Accordingly, the tunnel insulating film 251a may be separated to form the upper and lower tunnel insulating films 251au and 251ad. According to some example embodiments, by etching the tunnel insulating film 251a, the third side opening LOc may expand to form a fourth side opening LOd.

In the conventional art, the charge blocking film is doubly etched in the etching processes of the charge blocking film and the tunnel insulating film, and resulting in an excessive process distribution. Particularly, according to the process distributions in the processes of etching the upper and lower charge blocking films, the upper and lower charge storage films and the upper and lower tunnel insulating films, a parasitic transistor may be generated and may act as a switch device blocking a current path between the third semiconductor layer and the channel layer, resulting in a less reliable semiconductor device.

According to some example embodiments, since the upper and lower covers 251buc and 251bdc covering the upper and lower charge blocking films 251cu and 251cd may be formed before the tunnel insulating film 251a is etched, and the upper and lower charge blocking films 251cu and 251cd may be prevented from being doubly etched or reduce the extent or instance in which the upper and lower charge blocking films 251cu and 251cd are doubly etched. According to some example embodiments, therefore, the process distributions in the etching processes of a plurality of layers constituting the gate insulating film 251 may be controlled, and thus the reliability of the semiconductor memory device 10 (see FIG. 1A) may be improved.

Figure 11A:
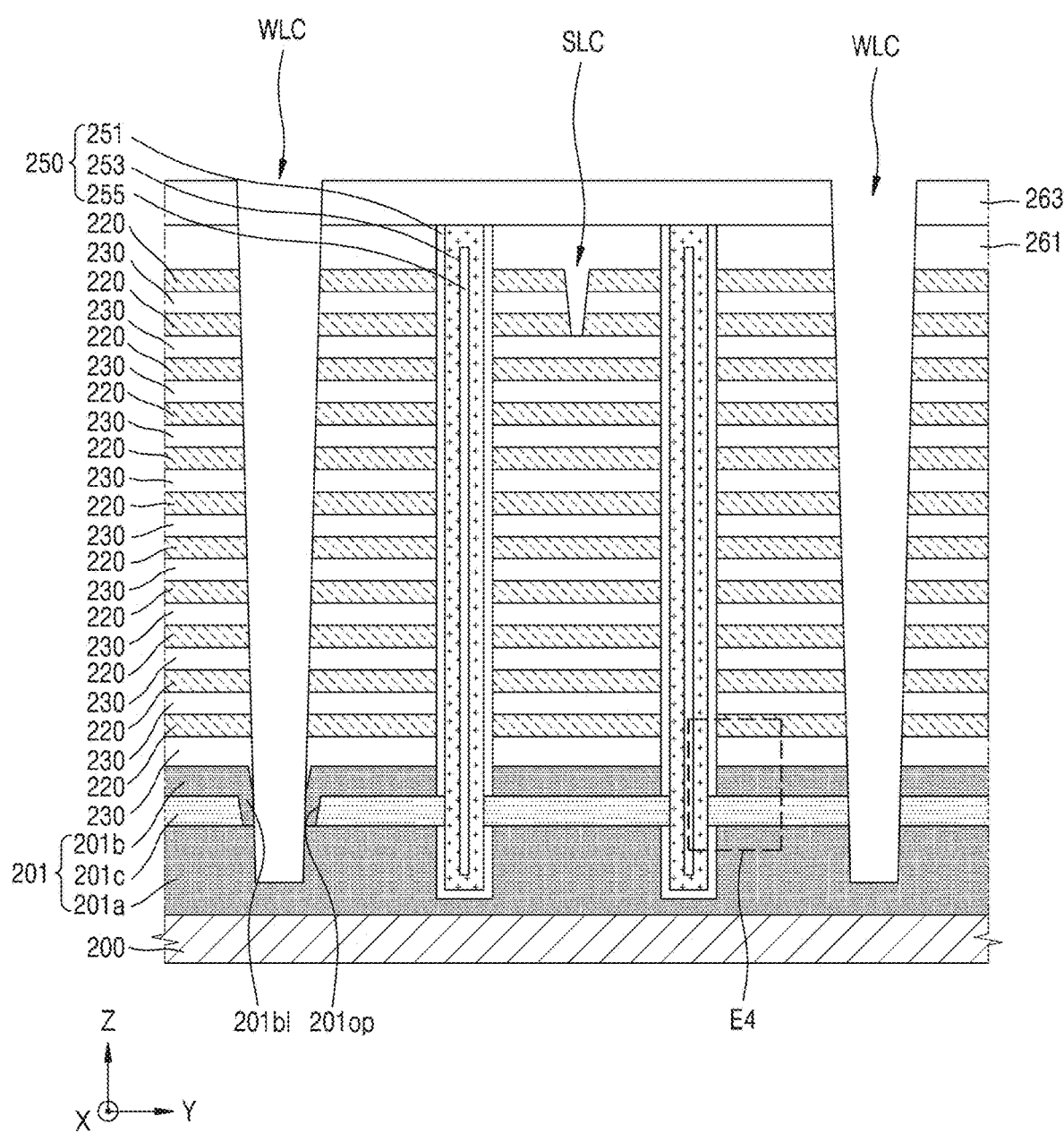
Figure 11B:
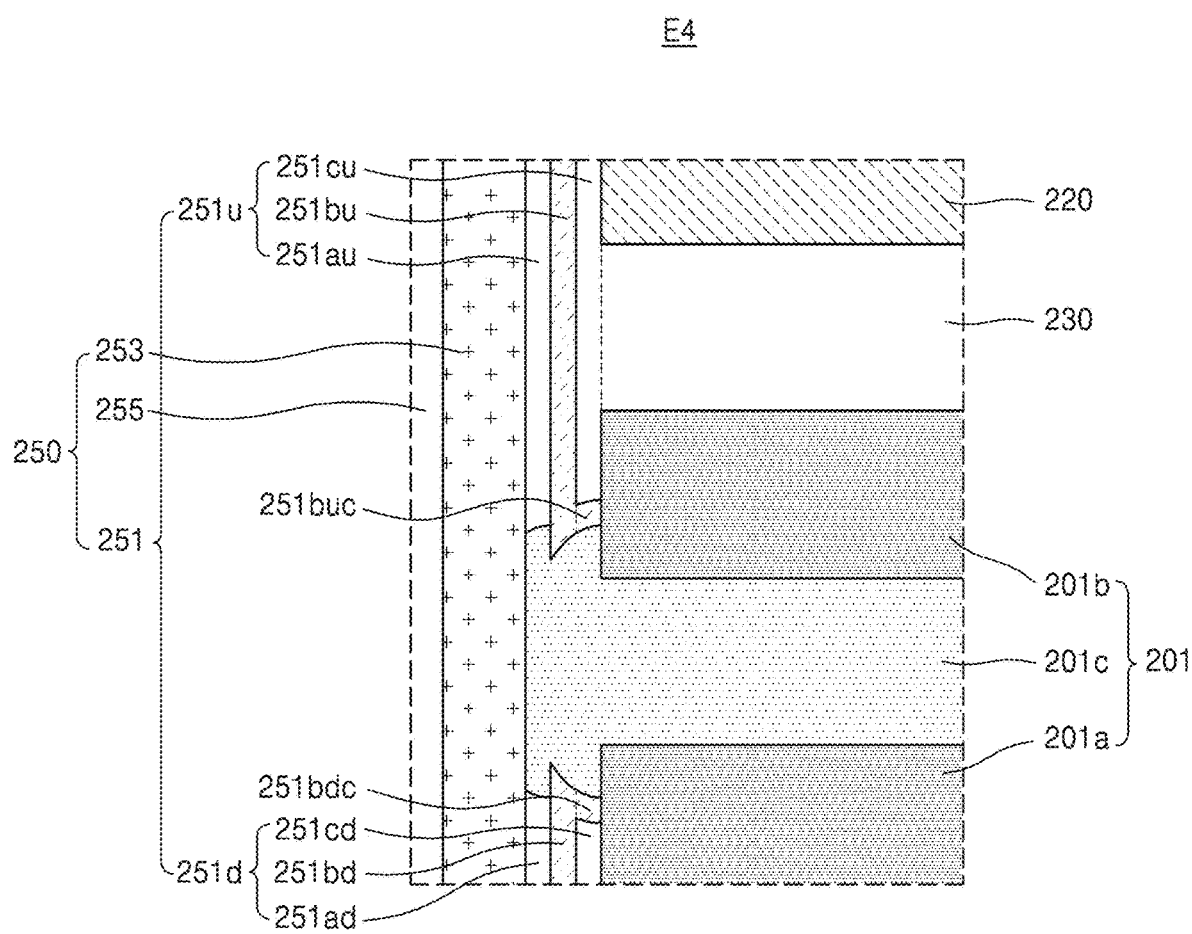

Referring to FIGS. 3, 11A and 11B, the third semiconductor layer 201c may be provided at P179. Here, FIG. 11B is a partial cross-sectional view corresponding to E4 in FIG. 11A.

The third semiconductor layer 201c may be provided in a space formed by selectively removing the sacrificial semiconductor layer 202 (see FIG. 7A). According to some example embodiments, the third semiconductor layer 201c may include polysilicon doped at the same or substantially the same concentration as the first and second semiconductor layers 201a and 201b. According to some example embodiments, the third semiconductor layer 201c may include polysilicon doped at a different concentration than the first and second semiconductor layers 201a and 201b, or undoped polysilicon. According to some example embodiments, the third semiconductor layer 201c may include the same or substantially the same concentration as the first and second semiconductor layers 201a and 201b through a diffusion of dopants contained in the first and second semiconductor layers 201a and 201b by a subsequent heat treatment process, but is not limited thereto. The newly formed third semiconductor layer 201c and the channel layer 253 may be in contact with each other. Accordingly, the channel structures 250 may be a charge transfer path for operating as a memory cell.

According to some example embodiments, since the third semiconductor layer 201c may fill the space formed by removing the sacrificial semiconductor layer 202 (see FIG. 7A), the opening 201op partially exposing the upper surface of the first semiconductor layer 201a may also be maintained.

Figure 12A:
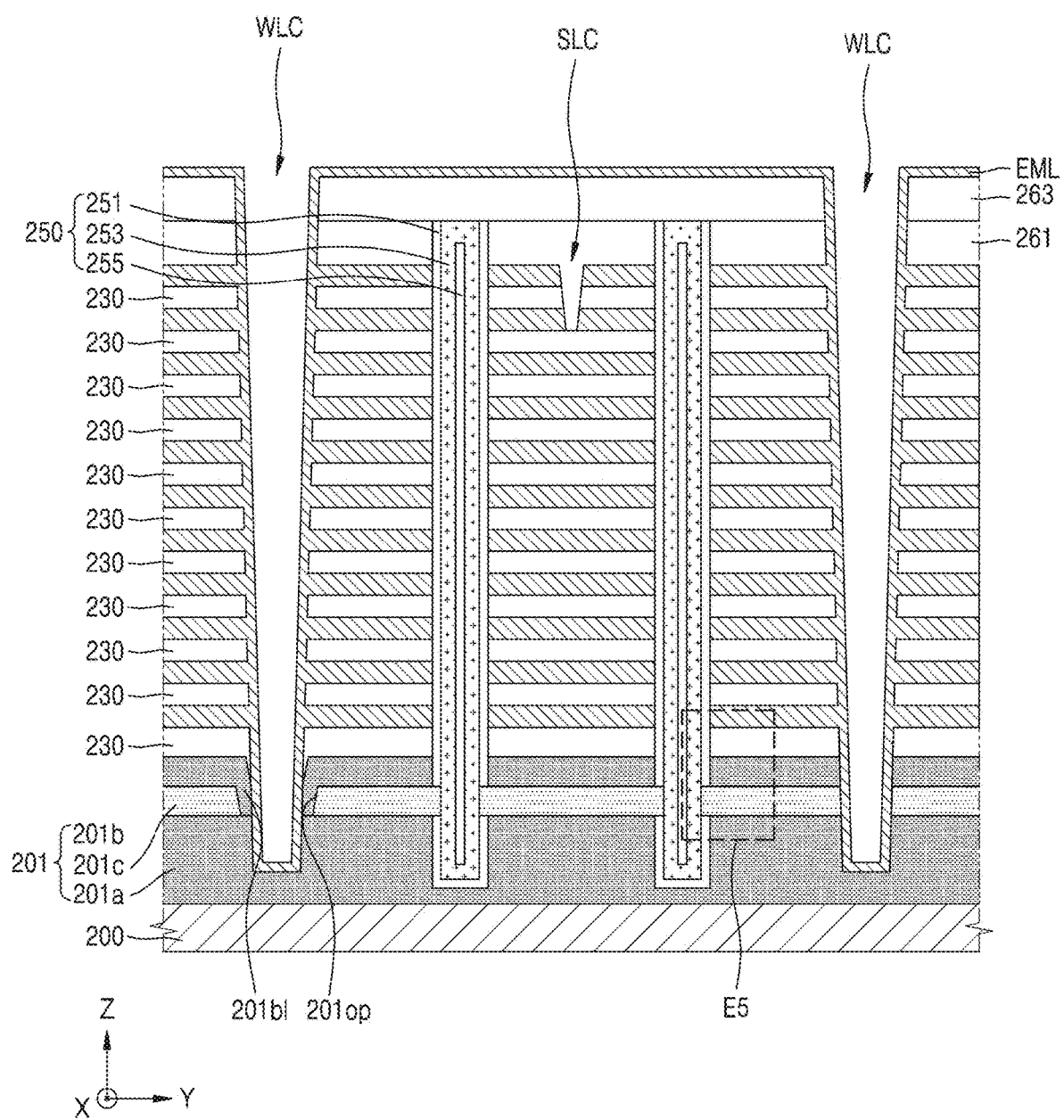
Figure 12B:
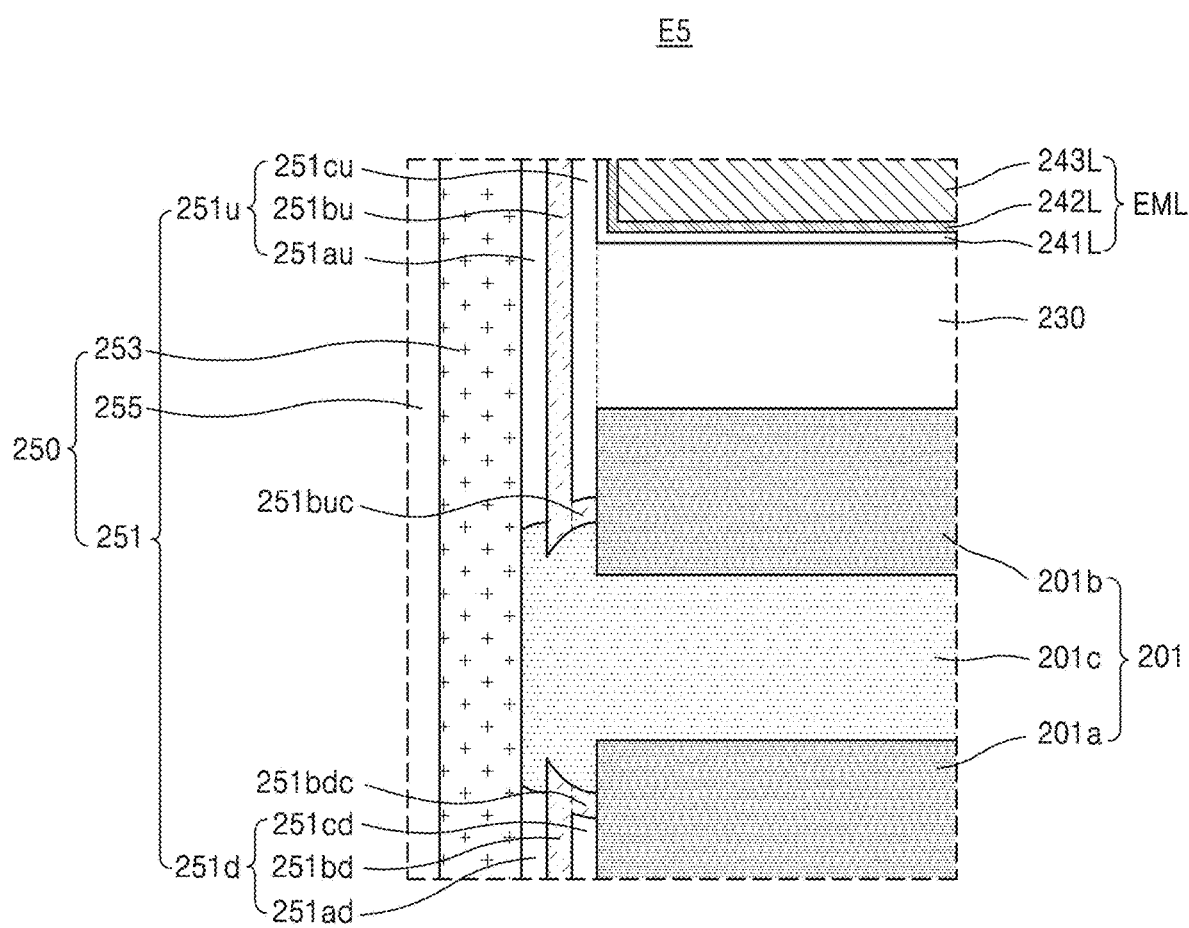

Referring to FIGS. 2, 12A, and 12B, a gate electrode material layer (EML) may be provided at P180. Here, the sacrificial films 220 may be removed before the gate electrode material layer EML is provided. Here, FIG. 12B is a partial cross-sectional view corresponding to E5 in FIG. 12A.

The gate electrode material layer EML may include a first barrier material layer 241L corresponding to the first barrier layer 241, a second barrier material layer 242L corresponding to the second barrier layer 242, and a gate conductive material layer 243L corresponding to the gate conductive layer 243, in sequence (see FIG. 1B). The first barrier material layer 241L may include aluminum oxide, the second barrier material layer 242L may include titanium nitride, and the gate conductive material layer 243L may include tungsten, but are not limited thereto.

Figure 13:
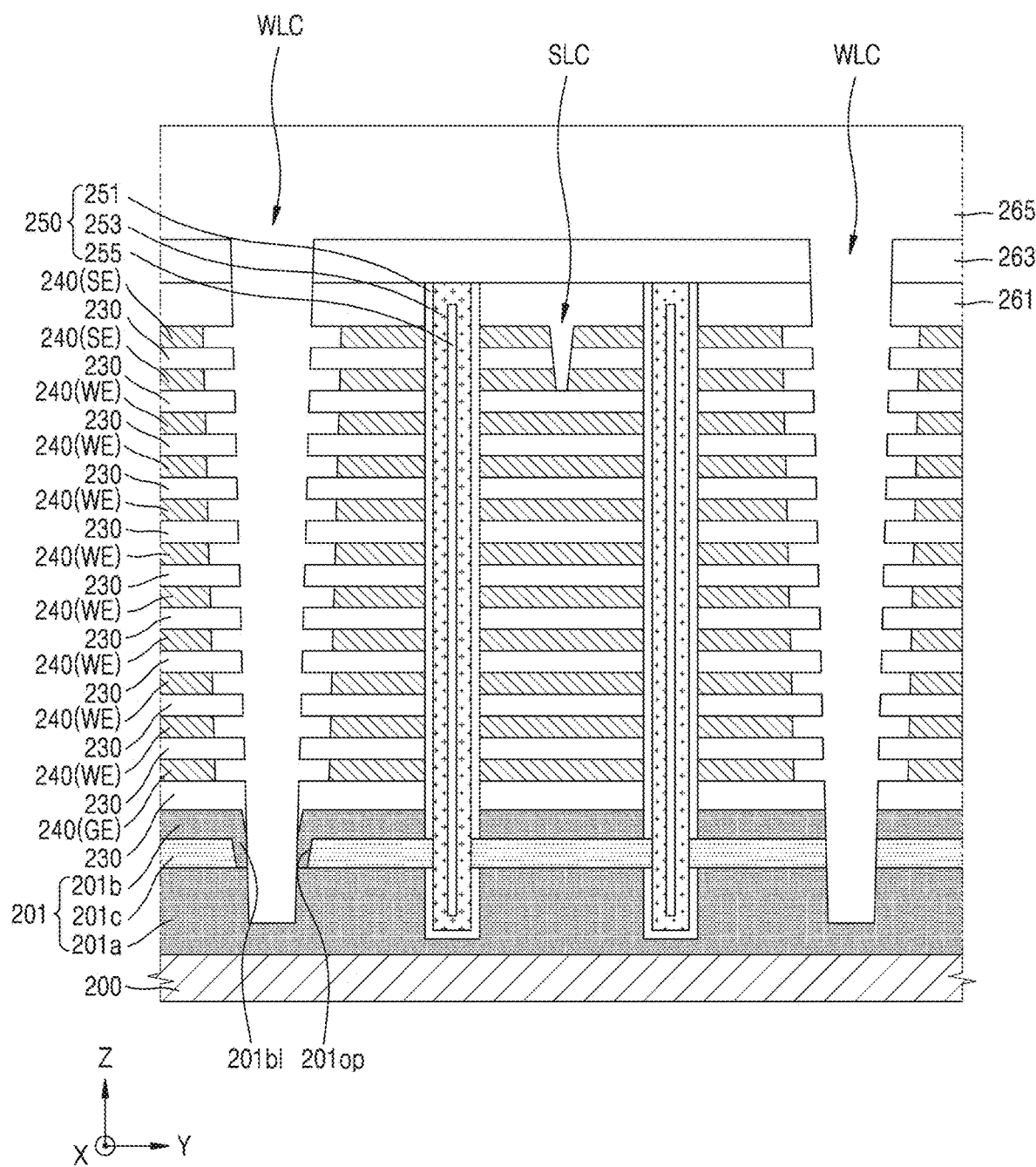

Referring to FIGS. 2, 12A, and 13, the third upper insulating film 265 may be provided after performing a node isolation process at P190.

The node isolation process may be a process of removing a portion of the exposed gate electrode material layer EML through the wet etching process. Accordingly, the gate electrode material layer EML formed on the different layers may be separated to form a plurality of gate electrodes 240. Then, the third upper insulating film 265 filling the word line cut WLC and covering an upper surface of the second upper insulating film 263 may be provided. The gate electrodes 240 horizontally separated from each other at the same vertical level or similar vertical levels may be insulated from each other by the third upper insulating film 265.

Then, referring again to FIG. 1A, by performing further some wiring processes, the upper conductive pattern 281, the first and second bit line contact vias 271 and 273, and the bit line BL may be further formed. Accordingly, the semiconductor memory device 10 may be provided.

Spatially relative terms, such as "beneath," "below," "lower," "above," "upper" and the like, may be used herein for ease of description to describe one element or feature's relationship to another element(s) or feature(s) as illustrated in the figures. For example, as used herein, the terms "upper," "higher," "on" and/or "top" may refer to an element or feature further in the Z direction (as depicted in FIG. 1A) with respect to another element or feature, and the terms "lower" and/or "below" may refer to an element or feature further in a direction opposite the Z direction with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the terms "below" can encompass both an orientation of above and below. The device may be otherwise oriented (rotated 90 degrees or at other orientations) and the spatially relative descriptors used herein interpreted accordingly. Likewise, the term "cover" may describe a relationship a first element or feature is either above or below a second element or feature.

It will be understood that when an element is referred to as being "connected" or "coupled" to another element, it can be directly connected or coupled to the other element or intervening elements may be present. As used herein the term "and/or" includes any and all combinations of one or more of the associated listed items. Also, as used herein, the term "fill" may describe partially or completely filling, and the term "cover" may describe partially or completely covering.

Some example embodiments are described herein with reference to cross-sectional illustrations that are schematic illustrations of idealized examples. As such, variations from the shapes of the illustrations as a result, for example, of manufacturing techniques and/or tolerances, are to be expected. Thus, some example embodiments should not be construed as limited to the particular shapes of regions illustrated herein but are to include deviations in shapes that result, for example, from manufacturing.

While some example embodiments have been particularly shown and described, it will be understood that various changes in form and details may be made therein without departing from the spirit and scope of the following claims.

What is claimed is:

1. A semiconductor memory device comprising:
a first semiconductor layer, a second semiconductor layer, and a third semiconductor layer between the first and second semiconductor layers;
a plurality of gate electrodes on the second semiconductor layer and spaced apart from each other in a first direction perpendicular to an upper surface of the second semiconductor layer; and
a plurality of channel structures penetrating the first, second and third semiconductor layers and the plurality of gate electrodes, each respective channel structure of the plurality of channel structures including a gate insulating film, a channel layer, and a buried insulating film, the gate insulating film including a tunnel insulating film adjacent to the channel layer, a charge blocking film adjacent to the plurality of gate electrodes, and a charge storage film between the tunnel insulating film and the charge blocking film, the charge storage film including an upper cover protruding in a second direction toward the outside of the respective channel structure, and the second direction being perpendicular to the first direction.

2. The semiconductor memory device of claim 1,
wherein a lower portion of the charge blocking film is spaced apart from the third semiconductor layer with the upper cover therebetween.

3. The semiconductor memory device of claim 1,
wherein a lower surface of the charge blocking film is covered with the upper cover.

4. The semiconductor memory device of claim 1,
wherein a level of a lower surface of the charge blocking film is between a level of an upper surface of the second semiconductor layer and a level of a lower surface of the second semiconductor layer.

5. The semiconductor memory device of claim 1,
wherein the upper cover is in contact with a side surface of the second semiconductor layer.

6. The semiconductor memory device of claim 1, further comprising:
a conductive flat plate under the first semiconductor layer and in contact with the first semiconductor layer.

7. The semiconductor memory device of claim 6,
wherein the conductive flat plate comprises one of tungsten or tungsten compound.

8. A semiconductor memory device comprising:
a first semiconductor layer and a second semiconductor layer on the first semiconductor layer;
a plurality of gate electrodes on the second semiconductor layer and spaced apart from each other in a first direction perpendicular to an upper surface of the second semiconductor layer; and
a plurality of channel structures penetrating the first and second semiconductor layers and the plurality of gate electrodes in the first direction, each of the plurality of channel structures including a gate insulating film, a channel layer, and a buried insulating film, the channel layer being connected to the first semiconductor layer, and the gate insulating film including an upper charge storage film in contact with a side surface of the second semiconductor layer.

9. The semiconductor memory device of claim 8,
wherein the first semiconductor layer and the second semiconductor layer are in contact with each other.

10. The semiconductor memory device of claim 8, further comprising:
an upper charge blocking film between the upper charge storage film and the second semiconductor layer.

11. The semiconductor memory device of claim 10,
wherein the upper charge storage film comprises an upper cover covering a lower surface of the upper charge blocking film.

12. The semiconductor memory device of claim 10,
wherein a width of the upper charge storage film at a first level is greater than a width of the upper charge storage film at a second level higher than the first level, the first level being below a level of the upper charge blocking film.

13. The semiconductor memory device of claim 10, wherein a width of the upper charge storage film is highest at a same level as a level of the second semiconductor layer.

14. The semiconductor memory device of claim 8, wherein the gate insulating film further comprises a lower charge storage film that contacts a lower surface of the first semiconductor layer.

15. The semiconductor memory device of claim 14, wherein the gate insulating film further comprises a lower charge blocking film spaced apart from the first semiconductor layer with the lower charge storage film therebetween.

16. A semiconductor memory device comprising:
a first semiconductor layer, a second semiconductor layer on the first semiconductor layer, and a third semiconductor layer between the first semiconductor layer and the second semiconductor layer;
a plurality of gate electrodes spaced apart from each other in a first direction perpendicular to an upper surface of the second semiconductor layer, the plurality of gate electrodes forming a word line cut in the first direction that separates the plurality of gate electrodes in a second direction perpendicular to the first direction; and
a plurality of channel structures penetrating the second and third semiconductor layers and the plurality of the gate electrodes in the first direction, each respective channel structure of the plurality of channel structures including a gate insulating film, a channel layer, and a buried insulating film, the third semiconductor layer including an opening that partially exposes an upper surface of the first semiconductor layer, the second semiconductor layer includes a support connection structure in contact with the first semiconductor layer at the opening, the gate insulating film including an upper tunnel insulating film, an upper charge blocking film, and an upper charge storage film between the upper tunnel insulating film and the upper charge blocking film, and the upper charge storage film including an upper cover protruding in the second direction toward the outside of the respective channel structure.

17. The semiconductor memory device of claim 16, further comprising:
an upper insulating film filling the word line cut, the upper insulating film not contacting the third semiconductor layer.

18. The semiconductor memory device of claim 16, wherein a lower surface of the upper charge storage film is closest to the first semiconductor layer among the lower surface of the upper charge storage film, a lower surface of the upper tunnel insulating film and a lower surface of the upper charge blocking film.

19. The semiconductor memory device of claim 16, wherein the third semiconductor layer has a discontinuous profile at a boundary between the upper charge storage film and the second semiconductor layer.

20. The semiconductor memory device of claim 19, wherein the third semiconductor layer has a discontinuous profile at a boundary between the upper tunnel insulating film and the upper charge storage film.

* * * * *